United States Patent
Fujita et al.

(10) Patent No.: US 9,666,952 B2
(45) Date of Patent: May 30, 2017

(54) ANTENNA DEVICE

(71) Applicant: Panasonic Intellectual Property Management Co., Ltd., Osaka (JP)

(72) Inventors: Suguru Fujita, Tokyo (JP); Yuichi Kashino, Ishikawa (JP); Maki Nakamura, Osaka (JP); Kentaro Watanabe, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 77 days.

(21) Appl. No.: 14/702,040

(22) Filed: May 1, 2015

(65) Prior Publication Data

US 2015/0325922 A1    Nov. 12, 2015

(30) Foreign Application Priority Data

May 7, 2014  (JP) ................................ 2014-096034
May 12, 2014 (JP) ................................ 2014-098639

(51) Int. Cl.
| | |
|---|---|
| *H01Q 1/38* | (2006.01) |
| *H01Q 19/06* | (2006.01) |
| *H01Q 3/16* | (2006.01) |
| *H01Q 19/10* | (2006.01) |
| *H01Q 21/06* | (2006.01) |

(52) U.S. Cl.
CPC .............. *H01Q 19/06* (2013.01); *H01Q 1/38* (2013.01); *H01Q 3/16* (2013.01); *H01Q 19/104* (2013.01); *H01Q 19/106* (2013.01); *H01Q 21/065* (2013.01)

(58) Field of Classification Search
CPC .................... H01Q 19/06; H01Q 1/38

USPC .................... 343/700 MS, 753, 872
See application file for complete search history.

(56) References Cited

U.S. PATENT DOCUMENTS

| | | | | |
|---|---|---|---|---|
| 5,041,842 A * | 8/1991 | Blaese | .................. | H01Q 11/08 343/882 |
| 5,955,752 A | 9/1999 | Fukaya et al. | | |
| 6,809,687 B2 * | 10/2004 | Yuanzhu | ................. | H01Q 1/38 343/700 MS |
| 7,446,712 B2 * | 11/2008 | Itoh | ..................... | H01Q 13/206 343/700 MS |
| 8,896,487 B2 * | 11/2014 | Chiang | ................ | G06F 1/1616 343/700 MS |
| 8,896,488 B2 * | 11/2014 | Ayala Vazquez | ...... | H01Q 1/243 343/702 |
| 9,203,142 B2 * | 12/2015 | Zhu | ........................ | H01Q 1/243 |
| 2006/0220977 A1 * | 10/2006 | Ogino | ..................... | H01Q 1/38 343/866 |
| 2012/0249388 A1 | 10/2012 | Hansen et al. | | |

FOREIGN PATENT DOCUMENTS

| | | |
|---|---|---|
| JP | 11-004118 | 1/1999 |
| JP | 2012-147135 A | 8/2012 |

* cited by examiner

*Primary Examiner* — Tho G Phan
(74) *Attorney, Agent, or Firm* — Seed IP Law Group LLP

(57) ABSTRACT

An antenna device includes a wireless module, a module substrate, and a metal plate. The wireless module includes an antenna element that operates in a millimeter wave band. The module substrate is a multi-layer wiring module substrate on which the wireless module is mounted. The metal plate has a length of $\frac{1}{10}$ or more of an operation wavelength and is positioned in a vertical direction relative to a plane surface of the antenna element and in a predetermined distance from the antenna element.

8 Claims, 24 Drawing Sheets

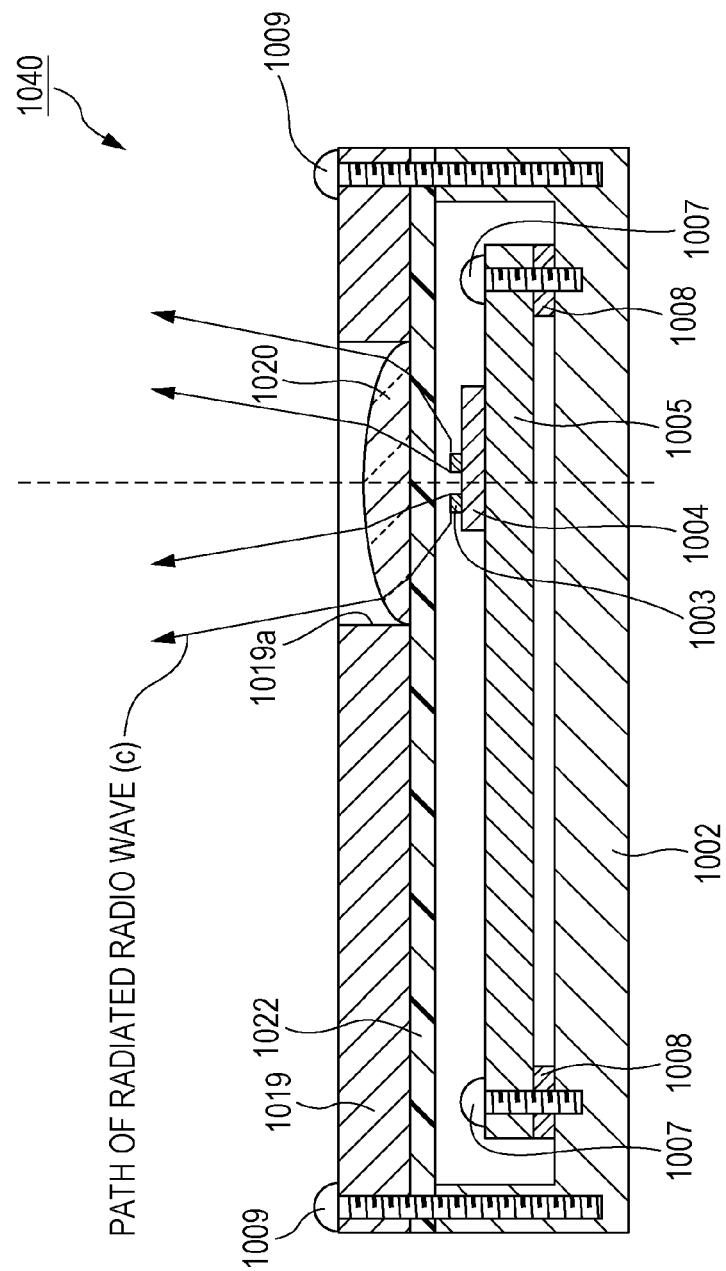

ANTENNA DEVICE

BACKGROUND

1. Technical Field

The present disclosure relates to an antenna device (wireless unit) used in an information device for microwave or millimeter-wave communication.

2. Description of the Related Art

Microwaves and millimeter-waves have high linearity since the wavelengths thereof are close to the wavelength of light. Thus, the setting of the directivity of an antenna is important for antenna devices using microwave or millimeter-wave wavelengths. U.S. Patent Application Publication No. 2012/0249388 (hereinafter, referred to as the patent literature), for example, describes a conventional antenna device in which the directivity of an antenna can be adjusted. In the antenna device described in the patent literature, a lens is used to adjust the directivity.

SUMMARY

In a conventional antenna device that uses a lens to vary the directivity of radio waves, cost should be considered. Particularly, the conventional antenna device requires a lens that has a shape enabling radio waves to be radiated in various directions in order to have various directivities. This increases the cost of the antenna device. In addition, in the conventional antenna device, it is difficult to vary the directivity of the radio waves by using a lens having a low-cost configuration, because the accuracy of the attachment of the lens affects characteristics of the directivity.

One non-limiting and exemplary embodiment provides an antenna device in which directivity of a radio wave is varied by a low-cost configuration.

In one general aspect, the techniques disclosed here feature an antenna device that includes an antenna element and a metal plate having a length of 1/10 or more of an operating wavelength and positioned in a vertical direction relative to a plane surface of the antenna element and in a predetermined distance from the antenna element.

According to the present disclosure, the directivity of the radio wave is varied by a low-cost configuration.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 28 is a cross-sectional side view illustrating a wireless unit according to a seventeenth embodiment.

DETAILED DESCRIPTION

Hereinafter, embodiments of the present disclosure are described with reference to the drawings.

Underlying Knowledge Forming Basis of Embodiments of the Present Disclosure

The microwave and the millimeter-wave have high linearity, and thus two information devices using the microwave or the millimeter wave can communicate with one another when the information devices are positioned such that the directivity patterns thereof extend toward each other. However, if three information devices, for example, are intended to communicate with one another, each information device needs to have a means for varying the directivity that allows the radio wave to travel toward the other two information devices.

Figure 13:
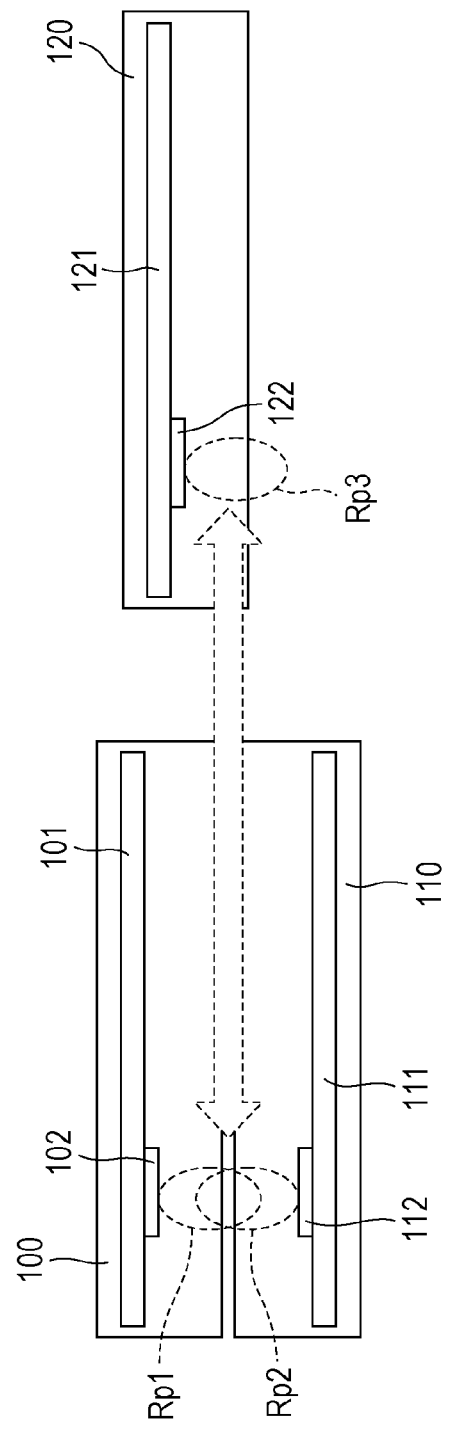
FIG. 13 is a view illustrating how a notebook computer including a conventional antenna device communicates with a docking station and a smartphone.

As illustrated in FIG. 13, for example, a notebook computer (information device) 100 and a docking station (information device) 110, which can communicate with each other via radio waves, are positioned such that the directivity patterns thereof extend toward each other. This enables communication between the notebook computer 100 and the docking station 110. However, the notebook computer (information device) 100 and the docking station (information device) 110 do not have directivity patterns extending toward a smartphone (information device) 120 and cannot communicate with the smartphone 120. In other words, the notebook computer 100 can establish communication with the docking station 110, but cannot establish communication with the smartphone 120.

In FIG. 13, the notebook computer 100 includes a motherboard 101 and a wireless module 102 mounted on the motherboard 101. The docking station 110 includes a motherboard 111 and a wireless module 112 mounted on the motherboard 111. A smartphone 120 includes a motherboard 121 and a wireless module 122 mounted on the motherboard 121. A radiation pattern Rp1 of the wireless module 102 in the notebook computer 100 and a radiation pattern Rp2 of the wireless module 112 in the docking station 110 extend toward each other. However, a radiation pattern Rp3 of the wireless module 122 in the smartphone 120 does not extend toward the radiation patterns Rp1 and Rp2.

Figure 14:
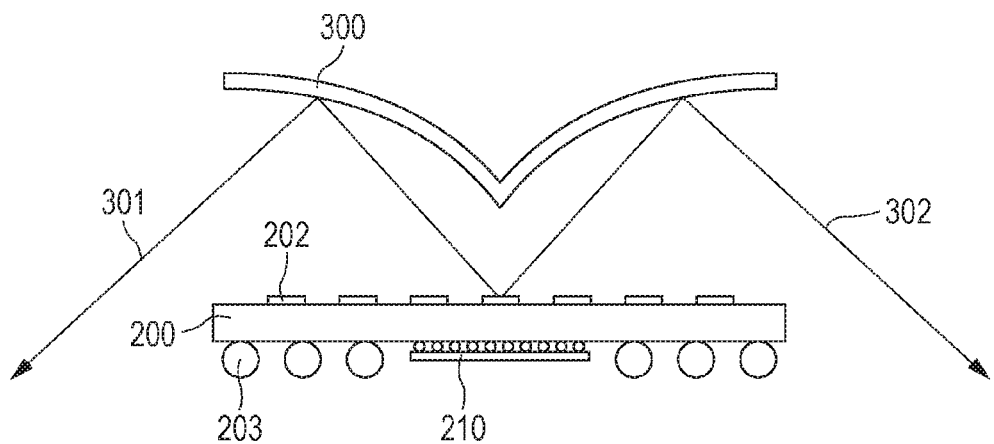
FIG. 14 is a view illustrating a configuration of a conventional antenna device.
Figure 15:
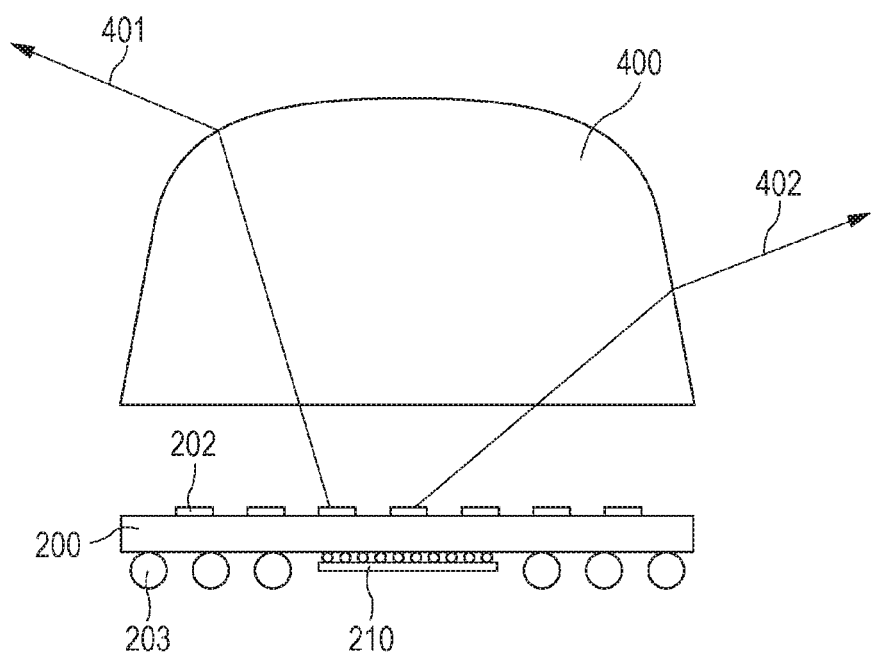
FIG. 15 is a view illustrating a configuration of a conventional antenna device.

The patent literature discloses the conventional antenna devices that have configurations illustrated in FIG. 14 and FIG. 15, for example, as means for varying the directivity of the radio waves.

FIG. 14 is a view illustrating a configuration of an antenna device that includes a reflective plate to vary the directivity of radio waves. As illustrated in FIG. 14, in the antenna device, a planar antenna 202, which is a primary radiator, is mounted on an upper surface of a module substrate 200, and an IC for wireless communication 210 is mounted on a lower surface of the module substrate 200. The module substrate 200 is mounted on a mounting substrate (not illustrated) by using balls 203. In the antenna device, a reflective plate 300, which is a secondary radiator, is disposed above the module substrate 200. In the antenna device, a radio wave from the planar antenna 202 is reflected by the reflective plate 300 in directions indicated by arrows 301 and 302 in FIG. 14. In other words, in the antenna device, a radiation direction is changed to a downward direction of the module substrate 200.

FIG. 15 is a view illustrating a configuration of an antenna device that includes a lens to vary the directivity of the radio wave. As illustrated in FIG. 15, in the antenna device, a lens 400, which is a secondary radiator, is disposed above the module substrate 200. In the antenna device, a radio wave from the planar antenna 202 is reflected by the lens 400 in directions indicated by arrows 401 and 402 in FIG. 15. In other words, in the antenna device, a radiation direction is changed to an oblique upward direction relative to the module substrate 200.

However, in the antenna device, if the directivity is varied by the reflective plate 300 that is positioned over the module substrate 200, the directivity is changed in a horizontal direction relative to the module substrate 200. As a result, it is difficult for the antenna device to communicate with an information device positioned directly above the module substrate 200.

In addition, in the antenna device, if the directivity is varied by the lens 400, the production cost of the antenna device increases, since the cost of the lens is high. Furthermore, the antenna device requires a lens having a shape enabling radio waves to be radiated in various directions at the same time in order to have various directivities. Such a lens requires a complex processing, which further increases the cost of the lens. In addition, in the antenna device, since attachment accuracy of the lens affects characteristics of the directivity, it is difficult to vary the directivity of the radio wave by employing a low-cost configuration.

Hereinafter, an antenna device in which directivity of a radio wave is varied by a low-cost configuration is described.

First Embodiment

Figure 1:
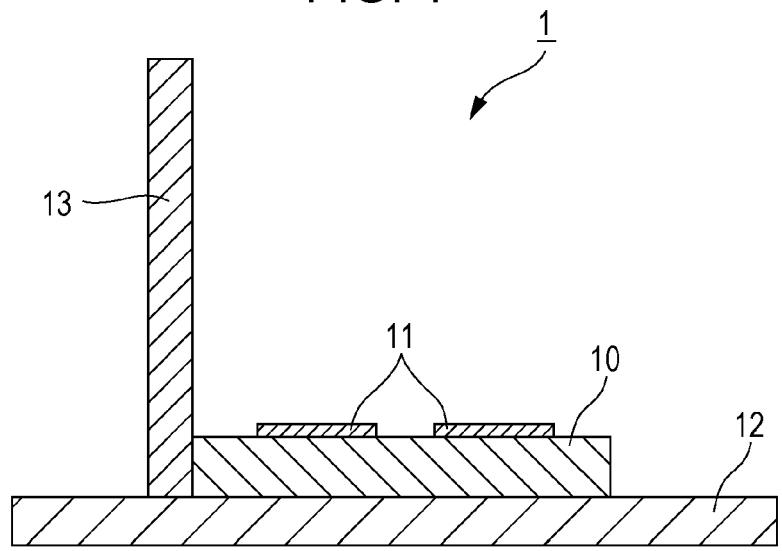
FIG. 1 is a cross-sectional view illustrating a configuration of an antenna device according to a first embodiment.

FIG. 1 is a cross-sectional view illustrating a configuration of an antenna device 1 according to a first embodiment. In FIG. 1, the antenna device 1 in this embodiment includes a wireless module 10, a multi-layer wiring module substrate (mounting substrate) 12, and a metal plate 13. The wireless module 10 includes an antenna element 11 that operates in a microwave band or a millimeter-wave band on an upper surface thereof. The multi-layer wiring module substrate (mounting substrate) 12 has the wireless module 10 thereon. The metal plate 13 is disposed in a vertical position near the antenna element 11.

The antenna element 11 includes a transmitting antenna element and a receiving antenna element. The antenna element 11 illustrated in FIG. 1 is the receiving antenna element, for example. The wireless module 10 includes an IC (Integrated Circuit) for wireless communication (not illustrated) that transmits (radiates) and receives radio waves through the antenna element 11. The metal plate 13 has a length of 1/10 or more of an operating wavelength. Here, if the antenna device 1 is used at 60 GHz, for example, the wavelength λ is 5 mm, and a specific length of the metal plate 13 is 0.5 mm, which is 1/10 of the wavelength.

Figure 2:
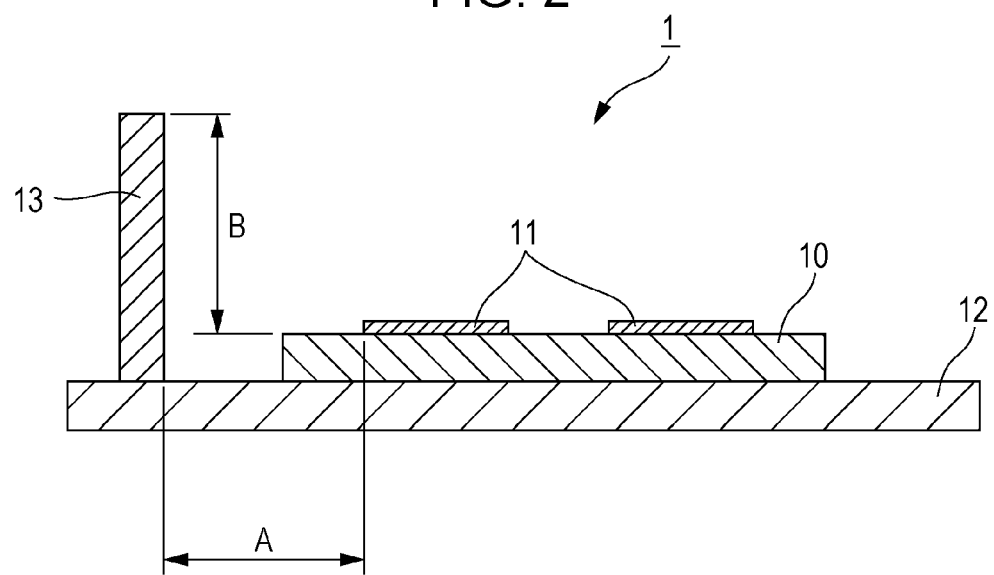
FIG. 2 is a view indicating a position of a metal plate relative to an antenna element in the antenna device according to the first embodiment.
Figure 3:
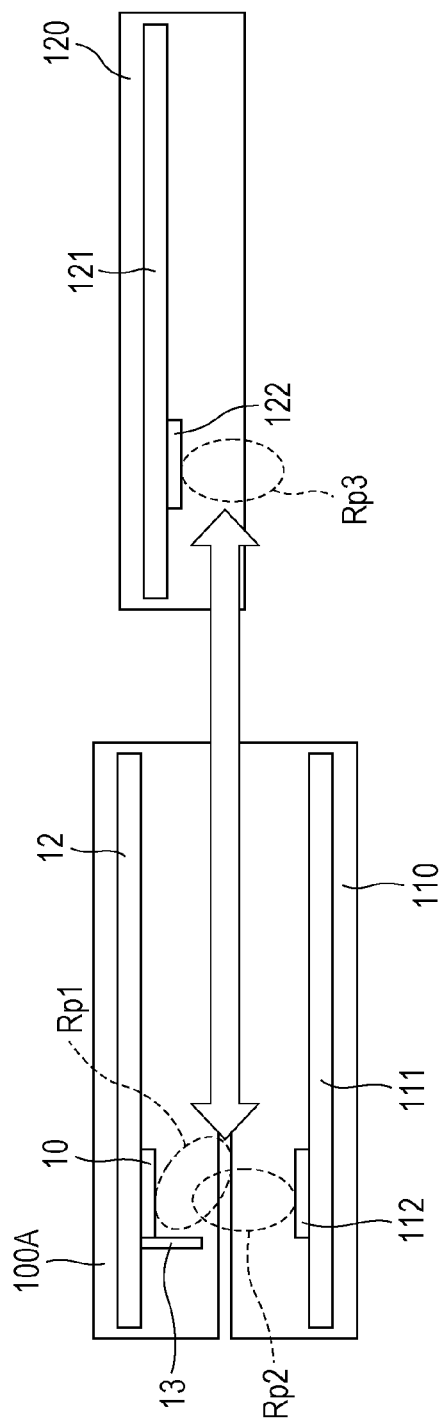
FIG. 3 is a view illustrating how a notebook computer including an antenna device according to the first aspect communicates with a docking station and a smartphone.

FIG. 2 is a view indicating a positional relationship between the metal plate 13 and the antenna element 11. In FIG. 2, "A" represents a distance from the antenna element 11 to the metal plate 13, and "B" represents a length of the metal plate 13 measured from a plane surface of the antenna element 11. The positional relationship between the metal plate 13 and the antenna element 11 preferably satisfies B≥A. The distance A is 1 mm and the length B is 5 mm, for example. In the antenna device 1 in FIG. 1, the radio wave radiated in the direction perpendicular to the antenna element 11 is reflected by the metal plate 13, and thus the directivity of the radio wave is changed to be in a diagonal right direction relative to the antenna element 11. In FIG. 3, for example, the directivity in the diagonal right direction enables a notebook computer 100A that includes the antenna device 1 according to this embodiment to establish communication with both of the docking station 110 and the smartphone 120.

In the antenna device 1, the radio waves transmitted from or received by the antenna element 11 can have any directivity by changing the height, the position, or the shape of the metal plate 13.

As described above, the antenna device 1 in this embodiment includes the metal plate 13 that has a length of 1/10 or more of the operating wavelength and is positioned near the antenna element 11 in the vertical position. With this low-cost configuration, the directivity pattern of the radio wave can be varied.

Second Embodiment

Figure 4:
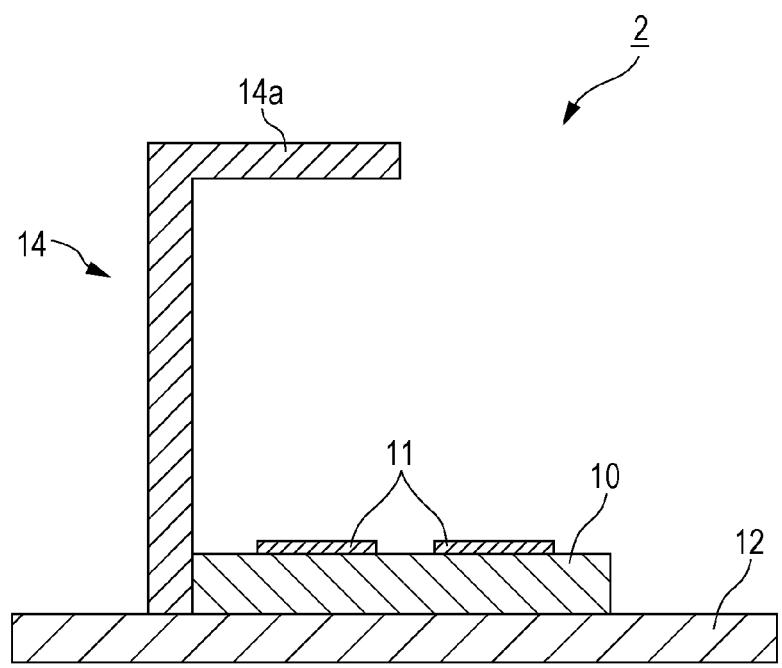
FIG. 4 is a cross-sectional view illustrating a configuration of an antenna device according to a second embodiment.
Figure 5:
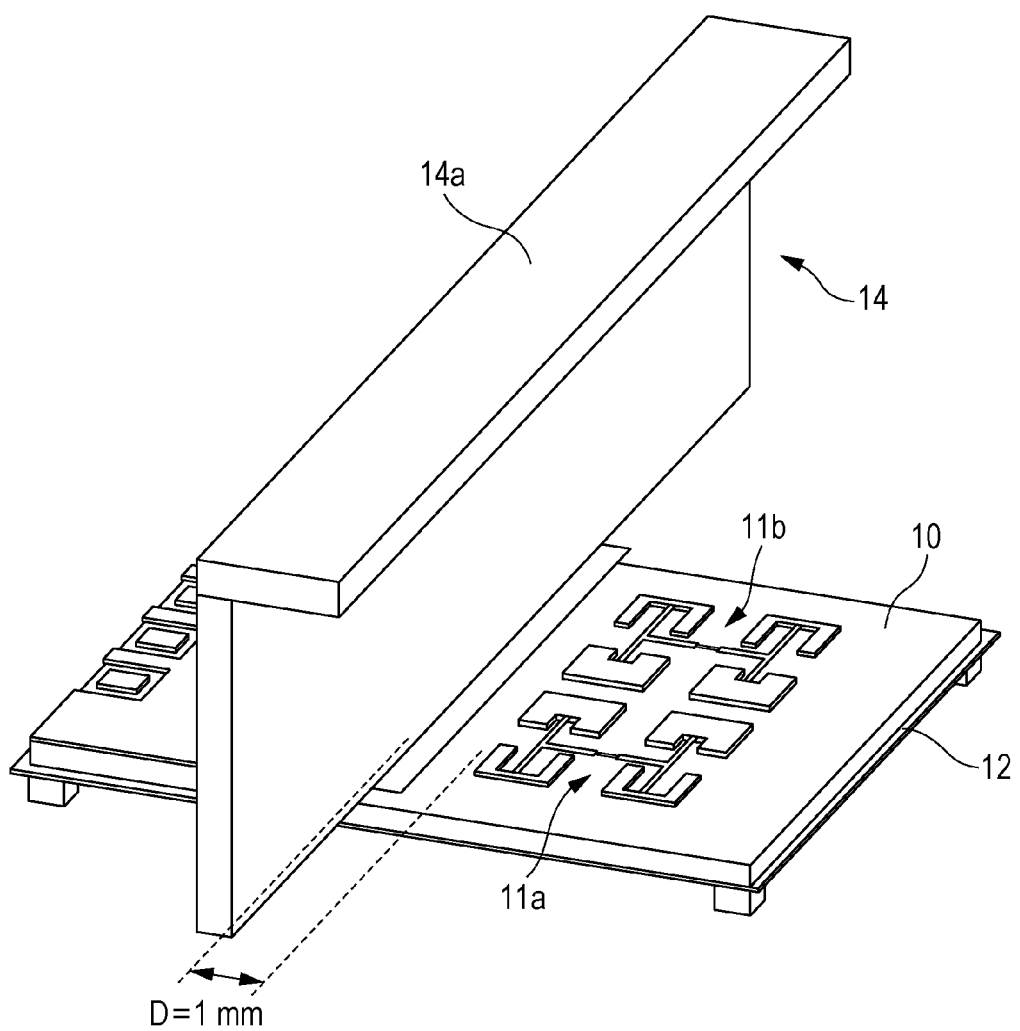
FIG. 5 is a perspective view illustrating an exterior of the antenna device according to the second embodiment.

FIG. 4 is a cross-sectional view illustrating a configuration of an antenna device according to a second embodiment. FIG. 5 is a perspective view illustrating an exterior of the antenna device according to the second embodiment. The components in FIG. 4 and FIG. 5 that are the same as those in FIG. 1 are assigned the same reference numerals as those in FIG. 1, and description thereof is omitted. An antenna device 2 according to this embodiment includes a metal plate 14 including a front end portion 14a that is bent at a right angle over a part of the antenna element 11. The front end portion 14a may be bent at any angle other than the right angle as long as the front end portion 14a is bent over the part of the antenna element 11. As illustrated in FIG. 5, the antenna element 11 mounted on the wireless module 10 includes a transmitting antenna element 11b and a receiving antenna element 11a. The metal plate 14 is separated from the antenna elements 11a and 11b by 1 mm.

Figure 6:
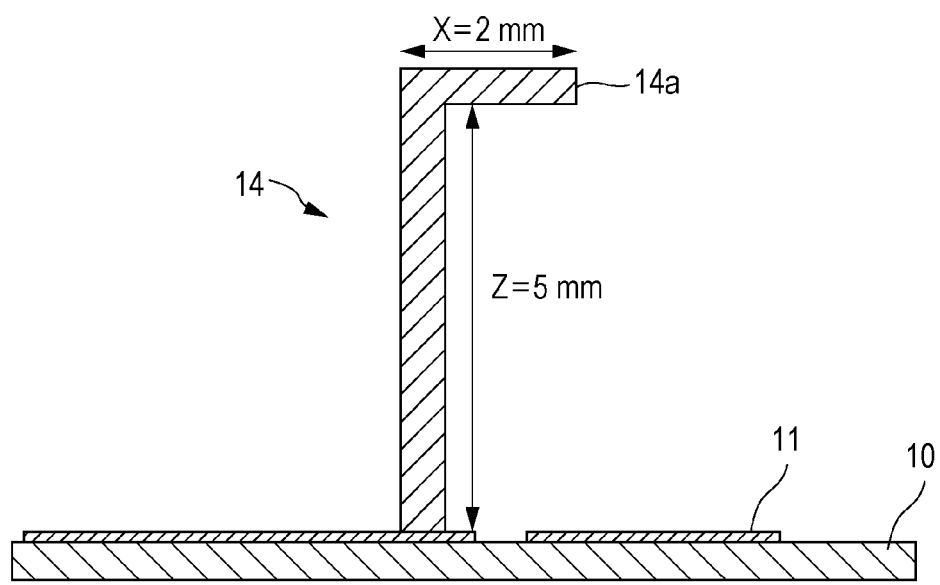
FIG. 6 is a view indicating a dimension of a metal plate of the antenna device according to the second embodiment.
Figure 7:
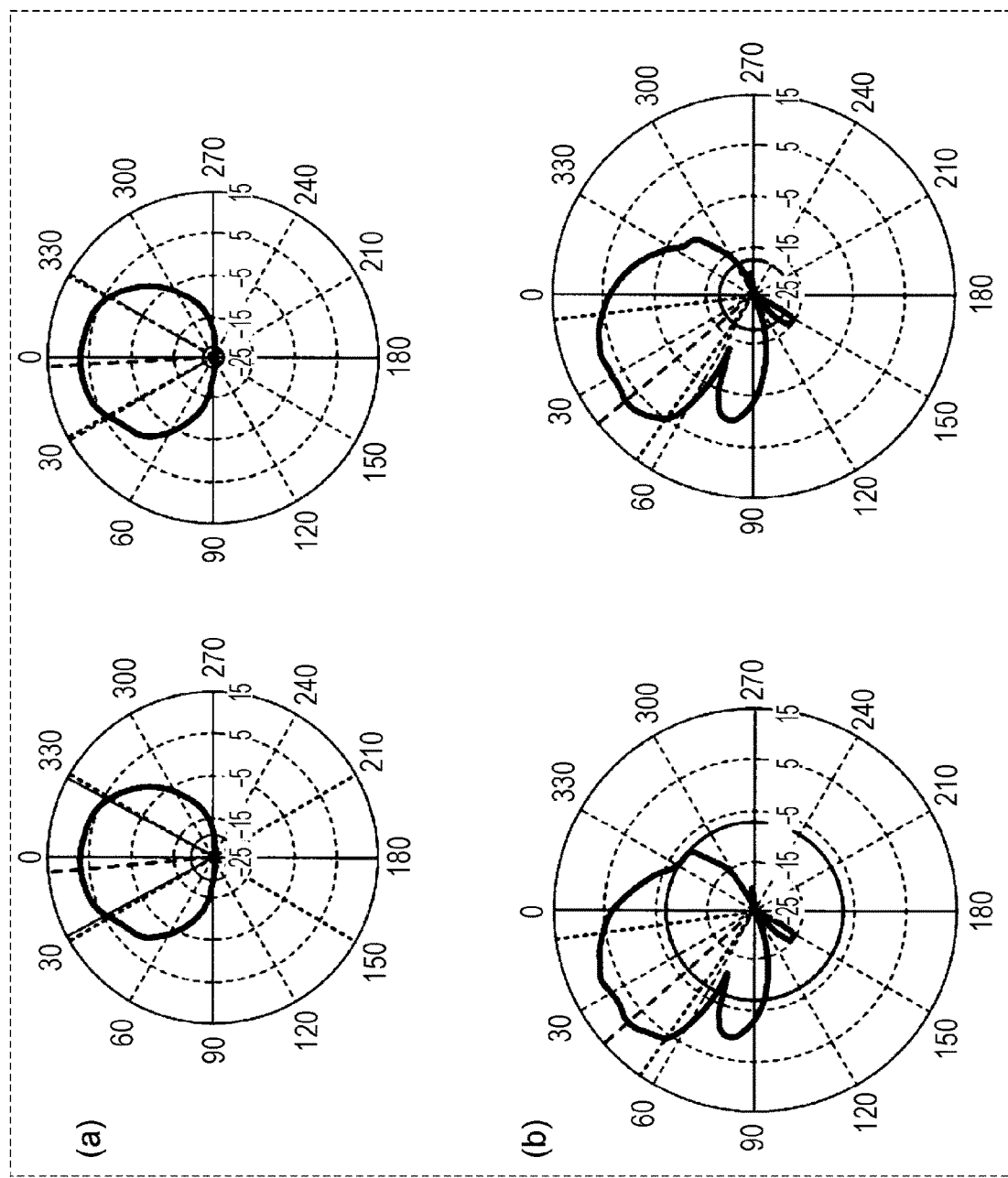
FIG. 7 is a view showing a difference between directivity of the antenna device according to the second embodiment that includes the metal plate and directivity of an antenna device that does not include the metal plate.

FIG. 6 indicates dimensions of the metal plate 14 of the antenna device 2 in this embodiment. As illustrated in FIG. 6, the metal plate 14 has a height Z of 5 mm that is substantially equal to a wavelength λ, for example. The front end portion 14a that is a bent portion has a length X of 2 mm that is shorter than a half of the wavelength λ. The above-described dimensions are examples and the dimensions may be any other values. FIG. 7 shows a difference between the directivity of an antenna device without the metal plate 14 (FIG. 7(a)) and the directivity (frequency of the radio wave is 61.36 GHz) of the antenna device including the metal plate 14 (FIG. 7(b)). The metal plate 14 is disposed on the right of the wireless module 10 in FIG. 7(a) and FIG. 7(b), although the metal plate 14 is disposed on the left of the wireless module 10 in FIG. 4 and FIG. 5. As shown in FIG. 7(a), the peak gain is obtained at about 0 degrees when the metal plate 14 is not provided. As illustrated in FIG. 7(b), the peak gain is obtained at about 40 degrees when the metal plate 14 is provided and the directivity is varied in the antenna device 2. In the antenna device 2, the front end portion 14a of the metal plate 14 is bent over the part of the antenna element 11 and the front end portion 14a blocks the radio waves traveling in the upward direction. Thus, the directivity pattern extends in an oblique direction. The front end portion 14a has a stronger influence on the directivity of the radio waves than the metal plate 13 in the first embodiment. The directivity in the antenna device 2 in this embodiment is changed more than the directivity in the antenna device 1 in the first embodiment.

As described above, the antenna device 2 in this embodiment includes the metal plate 14 including the front end portion 14a bent over the part of the antenna element 11. With this low-cost configuration, the directivity of the radio wave can be varied.

Third Embodiment

Figure 8:
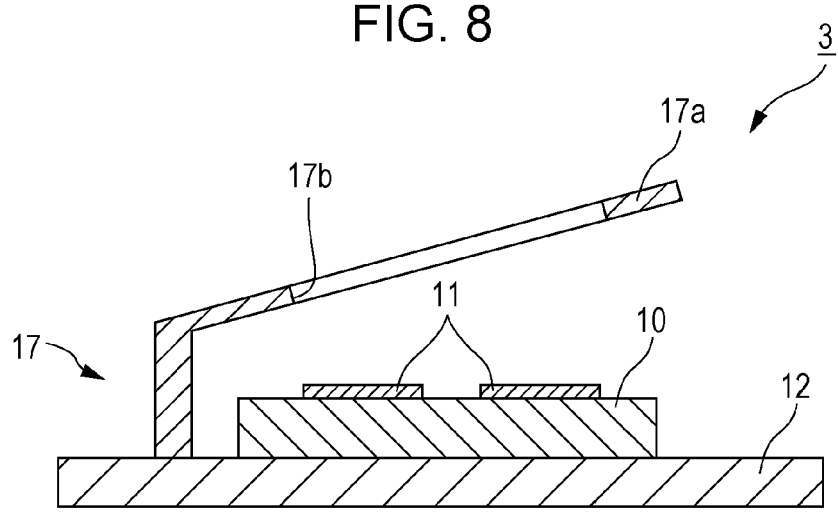
FIG. 8 is a cross-sectional view illustrating a configuration of an antenna device according to a third embodiment.
Figure 9:
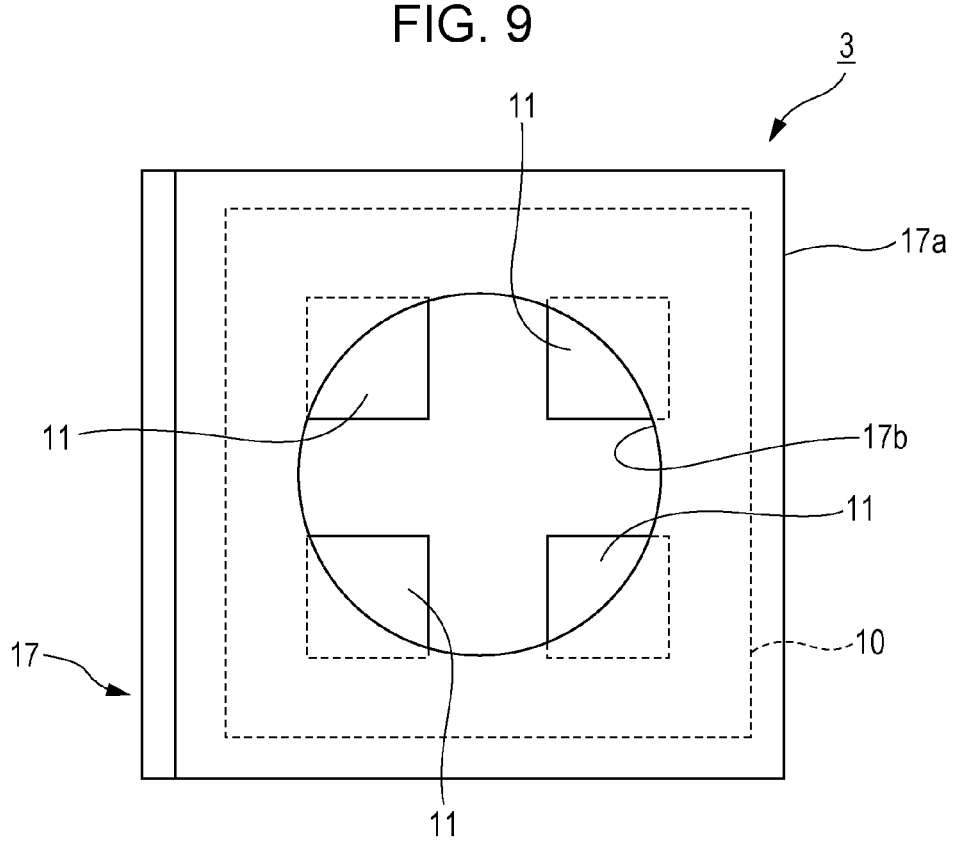
FIG. 9 is a top view of the antenna device according to the third embodiment.

FIG. 8 is a cross-sectional view illustrating a configuration of an antenna device according to a third embodiment. FIG. 9 is a top view of the antenna device in the third embodiment. The components in FIGS. 8 and 9 that are the same as those in FIG. 1 are assigned the same reference numerals as those in FIG. 1, and description thereof is omitted.

As illustrated in FIG. 8 and FIG. 9, an antenna device 3 in this embodiment includes a metal plate 17 including a portion that is bent as in the antenna device 2 in the second embodiment. Unlike the metal plate 14 of the antenna device 2 in the second embodiment, a bent portion 17a extends over an entire upper surface of the wireless module 10 diagonally relative to the wireless module 10 and has an opening 17b at a position above the antenna element 11. In the antenna device 3 including the metal plate 17, some of the radio waves from the antenna element 11 are radiated in a vertical direction through the opening 17b in the metal plate 17. The remaining radio waves are reflected by the bent portion 17a and radiated in a lateral direction at an angle in accordance with the bending angle of the bent portion 17a. The opening 17b in the metal plate 17 has a size of $1/10$ or more of the wavelength λ, for example.

As described above, the antenna device 3 in this embodiment includes the metal plate 17 including the bent portion 17a, which is the front end portion bent over the entire upper surface of the antenna element 11, and the bent portion 17a has the opening 17b at a position corresponding to a part of the antenna element 11. With this low-cost configuration, the directivity of the radio waves can be varied.

Fourth Embodiment

Figure 10:
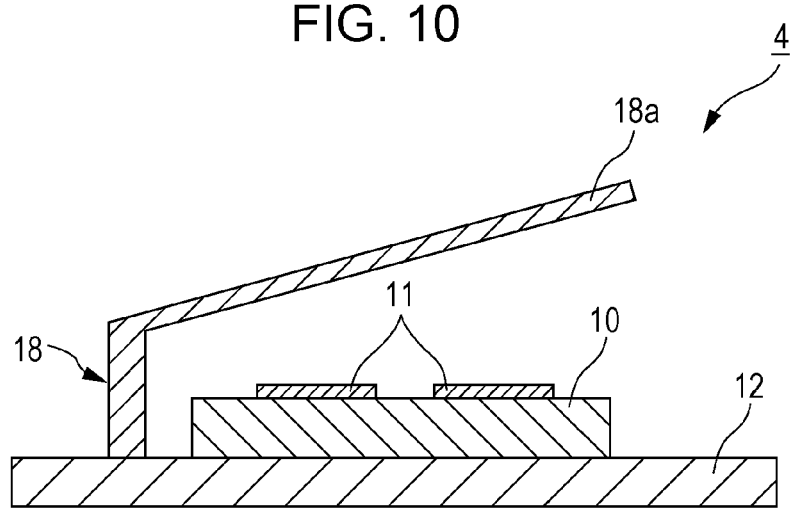
FIG. 10 is a cross-sectional view illustrating a configuration of an antenna device according to a fourth embodiment.
Figure 11:
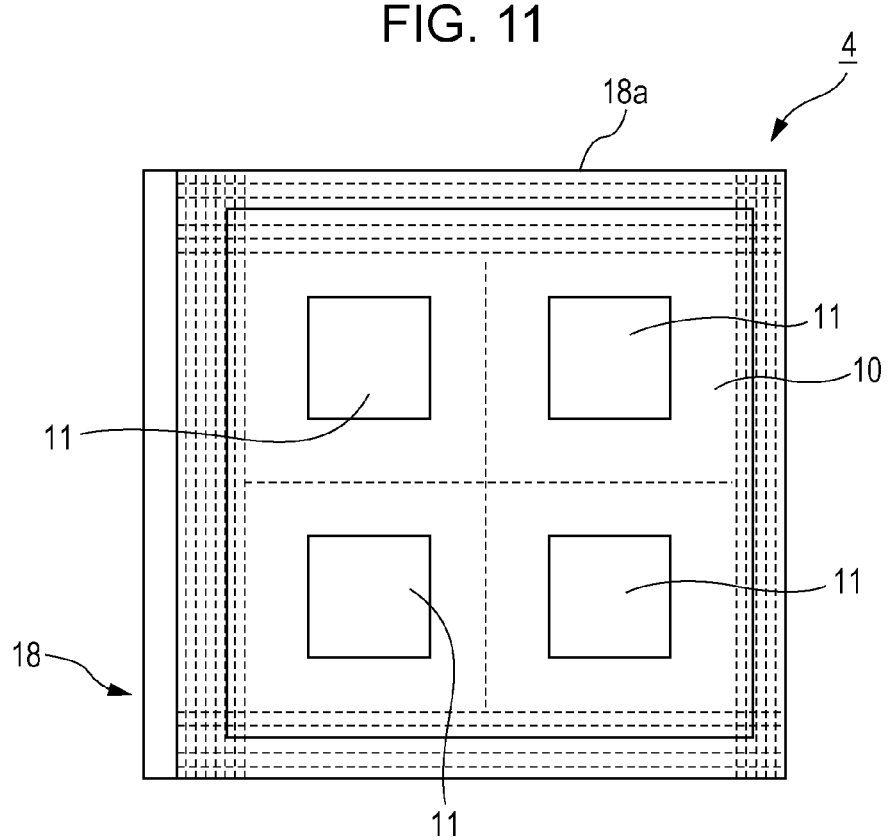
FIG. 11 is a top view of the antenna device according to the fourth embodiment.

FIG. 10 is a cross-sectional view illustrating a configuration of an antenna device according to a fourth embodiment. FIG. 11 is a top view of the antenna device in the fourth embodiment. The components in FIGS. 10 and 11 that are the same as those in FIG. 1 are assigned the same reference numerals as those in FIG. 1, and description thereof is omitted.

As illustrated in FIG. 10 and FIG. 11, an antenna device 4 in this embodiment includes a metal plate 18 including a portion that is bent as in the antenna device 3 in the third embodiment. Unlike the metal plate 17 of the antenna device 3 in the third embodiment, a bent portion 18a has a mesh structure. In the antenna device 4 including the metal plate 18 having the meshed bent portion, some of the radio waves from the antenna element 11 are radiated through openings of the meshed bent portion 18a of the metal plate 18 in the vertical direction. The remaining radio waves are reflected by metal parts of the meshed bent portion 18a and radiated in a lateral direction at an angle in accordance with the bending angle of the bent portion 18a. The bent portion 18a of the metal plate 18 has a mesh including openings each having a dimension of $1/10$ or more of the wavelength λ, for example.

As described above, the antenna device 4 in this embodiment includes the metal plate 18 including the meshed bent portion 18a that is the front end portion bent over the entire upper surface of the antenna element 11. With this low-cost configuration, the directivity of the radio waves can be varied.

Fifth Embodiment

Figure 12:
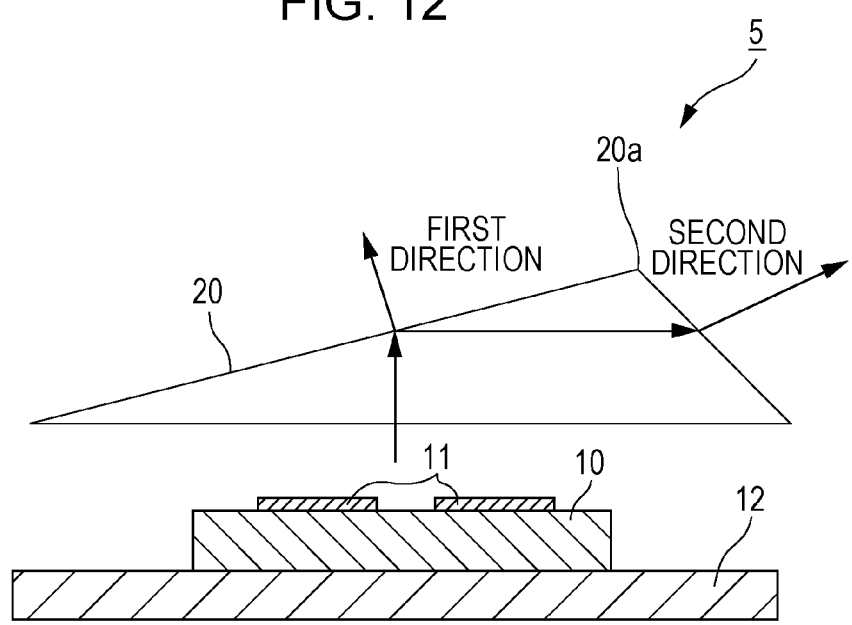
FIG. 12 is a cross-sectional view illustrating a configuration of an antenna device according to a fifth embodiment.

FIG. 12 is a cross-sectional view illustrating a configuration of an antenna device according to a fifth embodiment. The components in FIG. 12 that are the same as those in FIG. 1 are assigned the same reference numerals as those in FIG. 1, and description thereof is omitted.

As illustrated in FIG. 12, instead of the metal plate of the antenna devices 1 to 4 in the above-described first to fourth embodiments, an antenna device 5 in this embodiment includes a dielectric component 20 having a polygonal cross-sectional shape above the wireless module 10. In the antenna device 5, the dielectric component 20 is positioned such that a top 20a of the dielectric component 20 is not located directly above the antenna element 11 on the wireless module 10. Due to this positioning of the dielectric component 20, in the antenna device 5, radio waves from the antenna element 11 are radiated in both of a first direction and a second direction at the time of transmission, for example. This enables communication with devices positioned on an upper side and a lateral side of the wireless module 10.

As described above, the antenna device 5 of this embodiment includes the dielectric component 20 having the polygonal cross-sectional shape and disposed over at least a part of the upper surface of the antenna element 11. With this low-cost configuration, the directivity of the radio waves can be varied.

Underlying Knowledge Forming Basis of other Embodiments of the Present Disclosure In a wireless unit (antenna device) described in Japanese Unexamined Patent Application Publication No. 2012-147135 (hereinafter, referred to as a reference patent literature 1), the distance between the antenna and the lens is changed to vary directive gain. Thus, a factor of the directivity that can be changed by such a change in the position of the lens is a half-value angle. It is difficult to vary a main beam direction.

In a wireless unit described in Japanese Unexamined Patent Application Publication No. 11-004118 (hereinafter, referred to as a reference patent literature 2), a shape of the lens is changed to vary directive gain. This requires a lens having a specific shape designed for the predetermined directivity. If the predetermined directivity is changed, the lens needs to be redesigned, i.e., high accuracy of curvature is required in reproduction of the lens.

In the wireless unit described in the patent literature, the lens is positioned above the antenna to vary the directivity. However, the patent literature does not disclose how the lens is fixed. In addition, although characteristics of the directivity are affected by the accuracy of attachment of the lens, in the patent literature there is no mention of the accuracy of attachment.

The present disclosure was made in view of the above circumstances. The present disclosure relates to a wireless unit having a configuration that provides a larger variable range of directivity and minimizes the requirement for design change. In addition, the wireless unit does not require high accuracy of attachment of the lens.

A wireless unit of this disclosure includes a first chassis component, an antenna element housed in the first chassis component, and a second chassis component attached to the first chassis component and having an opening at a position corresponding to the antenna element.

In the present disclosure, directivity is varied by changing the size of the opening in the second chassis component, and thus the variable range of the directivity can be made larger. In addition, when a change in directivity is required, the directivity is changed by adjusting the size of the opening in the second chassis component so as to meet the requirement. This eliminates the need for redesign of the lens and minimizes the requirement for design change. In addition, if a lens is used, it is only required to provide a lens having a shape that can fit in the opening in the second chassis component. High accuracy of attachment is achieved by inserting such a lens into the opening in the second chassis component.

Hereinafter, other embodiments of the present disclosure are described with reference to the drawings.

The reference patent literature 1 describes an antenna that radiates radio waves, a lens antenna that varies the directivity of the radio waves from the antenna, a tubular lens-antenna holder that holds the lens antenna, and screws that allow a change in the attachment position of the lens antenna relative to the lens-antenna holder. In addition, the reference patent literature 2 describes an antenna element on a substrate, and an airtight sealing member, which is a replaceable lens, positioned above the antenna element. The patent literature describes a planar antenna, and a reflective plate and a lens antenna each of which is positioned above the planar antenna.

In the technique described in the reference patent literature 1, a focal distance is varied by changing the distance between the antenna and the lens antenna, and thus the gain of the lens antenna is varied. In the technique described in the reference patent literature 2, the shape of the lens is changed such that the radio waves have predetermined directivity. In the technique described in the patent literature, the lens antenna or the reflective plate is disposed above the planar antenna to vary the radiation pattern of the radio waves.

However, although the technique described in the reference patent literature 1 changes the position of the lens antenna by the screws to vary the directivity, a variable range of the directivity is small. In addition, although the technique described in the reference patent literature 2 changes the shape of the lens to vary the directivity, the shape of the lens needs to be determined in advance depending on the predetermined directivity. If the predetermined directivity is changed, the lens needs to be redesigned. Furthermore, the technique described in the patent literature does not describe how the lens and the reflective plate are fixed. The patent literature does not describe how to fix the lens and the reflective plate, although the directivity is affected by the accuracy of the attachment of the lens and the reflective plate.

Hereinafter, a wireless unit is described. The wireless unit has a configuration that provides a larger variable range of directivity and minimizes the requirement for design change. In addition, the wireless unit does not require high accuracy of attachment of a lens.

Other Embodiments of the Present Disclosure

Sixth Embodiment

Figure 16:
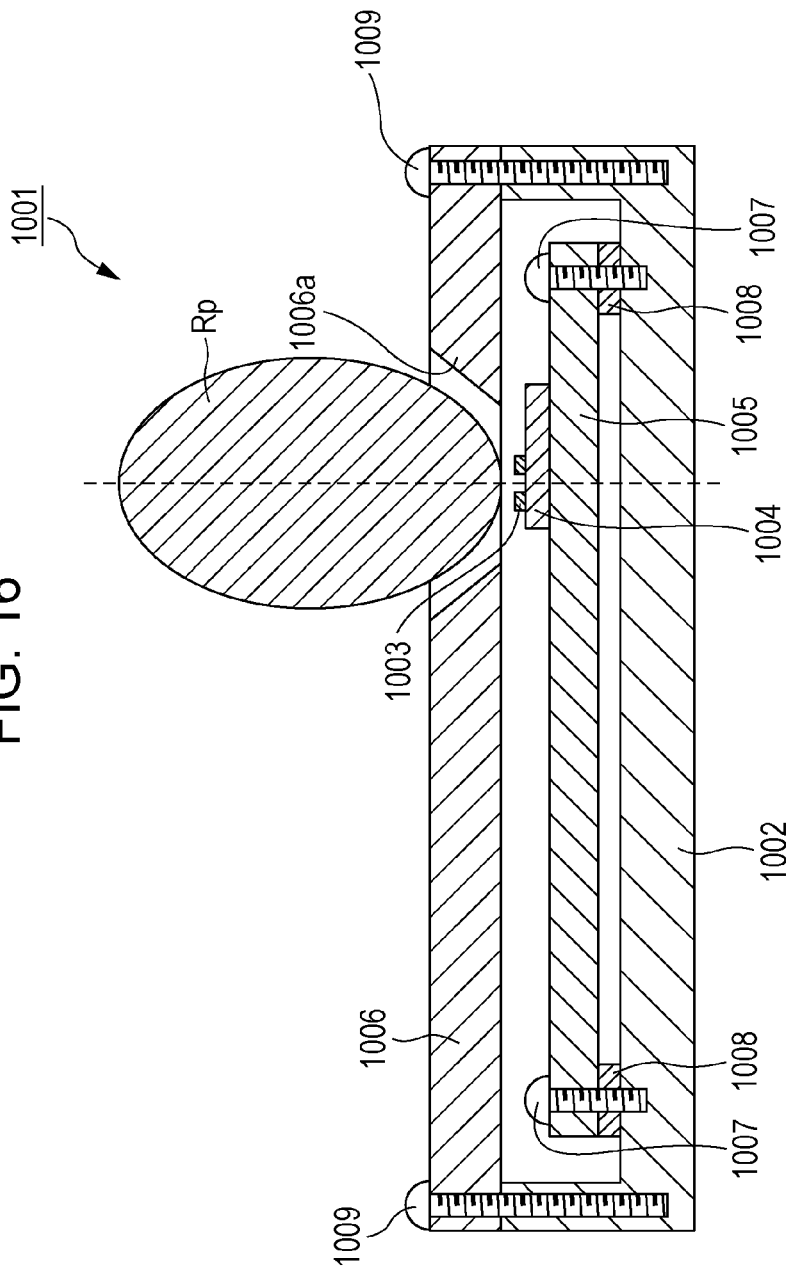
FIG. 16 is a cross-sectional side view illustrating a wireless unit according to a sixth embodiment.
Figure 17:
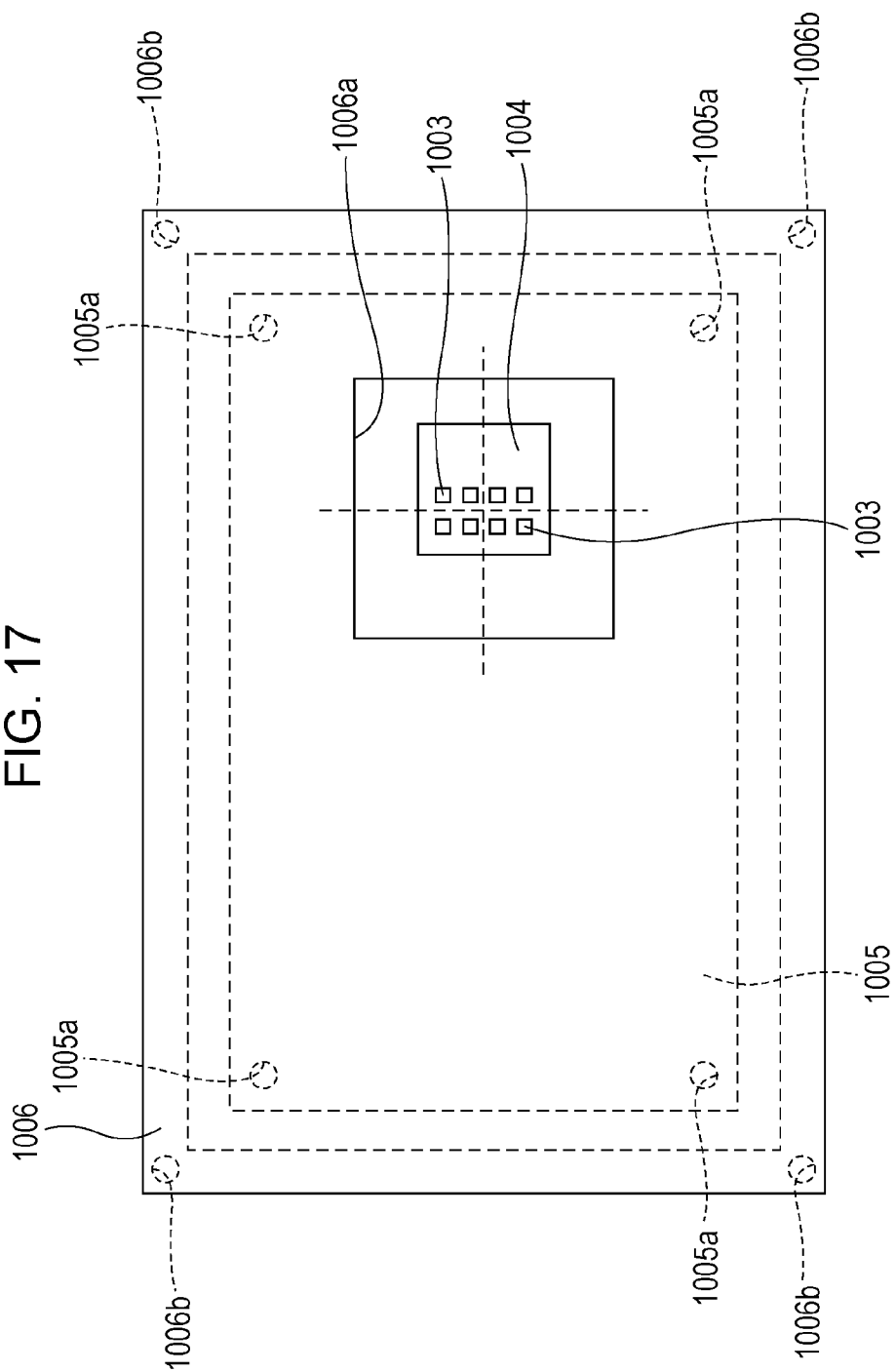
FIG. 17 is a top plan view of the wireless unit illustrated in FIG. 16.

FIG. 16 is a cross-sectional side view illustrating a configuration of a wireless unit according to a sixth embodiment. FIG. 17 is a top plan view of the wireless unit illustrated in FIG. 16. As illustrated in FIG. 16 and FIG. 17, a wireless unit 1001 in this embodiment includes a first chassis component 1002, a wireless unit substrate 1005, and a second chassis component 1006. The first chassis component 1002 has a rectangular overall shape and a U-shaped cross-sectional shape. The wireless unit substrate 1005 is housed in the first chassis component 1002, and a wireless module 1004 having an antenna element 1003 that operates in a millimeter-wave band is disposed on a part of a surface of the wireless unit substrate 1005 that faces an opening in the first chassis component 1002. The second chassis component 1006 has a rectangular plate-like shape so as to be attached to the opening in the first chassis component 1002 and has an opening 1006a at a position corresponding to the antenna element 1003 of the wireless module 1004.

The wireless unit 1001 is attached to a target object (wireless communication device, for example) through the first chassis component 1002. The radio waves are radiated through the second chassis component 1006. The first chassis component 1002 and the second chassis component 1006 are made of metal. The wireless module 1004, which is mounted on the wireless unit substrate 1005, includes a module substrate (not illustrated) having a multi-layer board including an IC. The antenna element 1003 and an IC module for wireless communication (not illustrated) are mounted on the module substrate, for example. In the present embodiment, the wireless module 1004 includes eight antenna elements 1003. Four antenna elements 1003 are arranged in each of two rows as illustrated in FIG. 17.

As illustrated in FIG. 17, the wireless unit substrate 1005 includes substrate fixation screw holes 1005a at four corners thereof to fix the wireless unit substrate 1005 to the first chassis component 1002. The wireless unit substrate 1005 is fixed to the first chassis component 1002 by substrate fixation screws 1007 inserted into the substrate fixation screw holes 1005a. The wireless unit substrate 1005 is spaced apart from the first chassis component 1002 with spacers 1008 disposed therebetween. The spacers 1008 are disposed near the substrate fixation screws 1007. The spacers 1008 are made of metal or resin. The second chassis component 1006 includes chassis fitting screw holes 1006b at four corners thereof to fix the second chassis component 1006 to the first chassis component 1002. The second chassis component 1006 is fixed to the first chassis component 1002 by chassis fitting screws 1009 inserted into the chassis fitting screw holes 1006b.

The opening 1006a in the second chassis component 1006 is substantially square. The opening 1006a in the second chassis component 1006 has a center aligned with a center of the eight antenna elements 1003 mounted on the first chassis component 1002. The opening 1006a in the second chassis component 1006 has a tapered shape and has a large opening area at an upper side thereof than at a lower side thereof. The opening 1006a in the second chassis component 1006 may have any shape as long as an antenna radiation pattern Rp (shaded area in FIG. 16) of the antenna element 1003 is not affected. The edge of the opening 1006a in the second chassis component 1006 may be positioned away from the antenna elements 1003 by ½ of the wavelength or more. The radio waves from the eight antenna elements 1003 are radiated through the opening 1006a in the second chassis component 1006. The antenna radiation pattern Rp through the opening 1006a in the second chassis component 1006 is in an elliptical shape as illustrated in FIG. 16. The antenna radiation pattern Rp becomes more circular as the opening 1006a in the second chassis component 1006 becomes larger and becomes a more vertically-elongated elliptical shape as the opening 1006a becomes smaller. The directivity of the radio wave becomes lower as the shape of the antenna radiation pattern Rp becomes closer to a circle and becomes higher as the shape thereof becomes closer to an ellipse.

As described above, in the wireless unit 1001 in this embodiment, the directivity is varied by changing the tapered shape of the opening 1006a in the second chassis component 1006. The variable range of the directivity can be made larger. In addition, when a change in directivity is required, the directivity can be varied by changing the tapered shape of the opening 1006a in the second chassis component 1006. This eliminates the need for redesign of a lens and minimizes the requirement for design change of the components.

Seventh Embodiment

Figure 18:
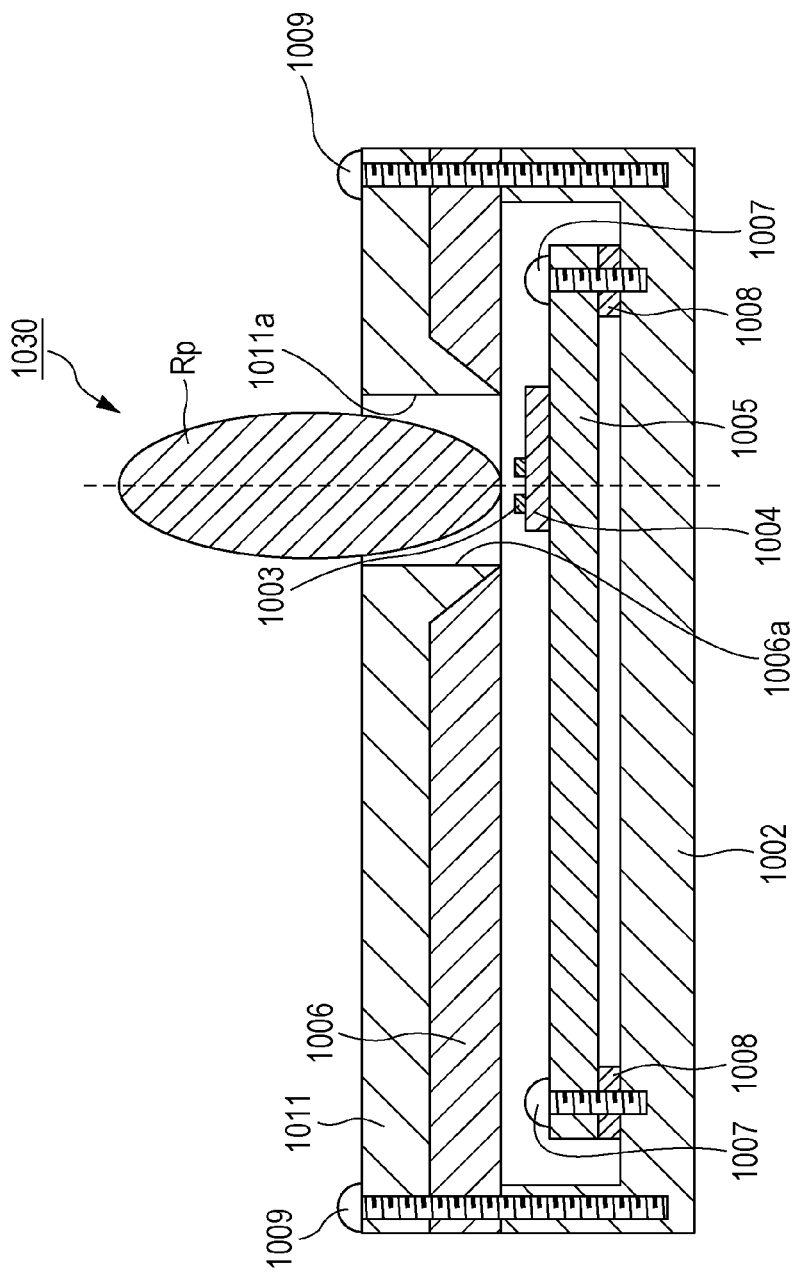
FIG. 18 is a cross-sectional side view illustrating a wireless unit according to a seventh embodiment.

FIG. 18 is a cross-sectional side view illustrating a configuration of a wireless unit according to a seventh embodiment. The components in FIG. 18 that are the same as those in FIG. 16 are assigned the same reference numerals as those in FIG. 16, and description thereof is omitted. As illustrated in FIG. 18, a wireless unit 1030 in this embodiment includes a chassis cover 1011 on an upper surface of the second chassis component 1006. The chassis cover 1011 is made of metal and is disposed so as to change the directivity of the antenna element 1003. The chassis cover 1011 has an opening 1011a. The opening 1011a has a center aligned with the center of the opening 1006a in the second chassis component 1006. The opening 1011a in the chassis cover 1011 is substantially a square. The opening 1011a has a dimension equal to the smallest dimension of the opening 1006a in the second chassis component 1006 having a tapered shape (lowest side of the opening 1006a in the second chassis component 1006). In the wireless unit 1030, the directivity of the radio wave is made narrower by making the opening 1011a, through which the radio wave is radiated, smaller. In the wireless unit 1030, the directivity is readily changed by attaching the chassis cover 1011 for varying the directivity of the antenna element 1003 on the upper surface of the second chassis component 1006.

Eighth Embodiment

Figure 19:
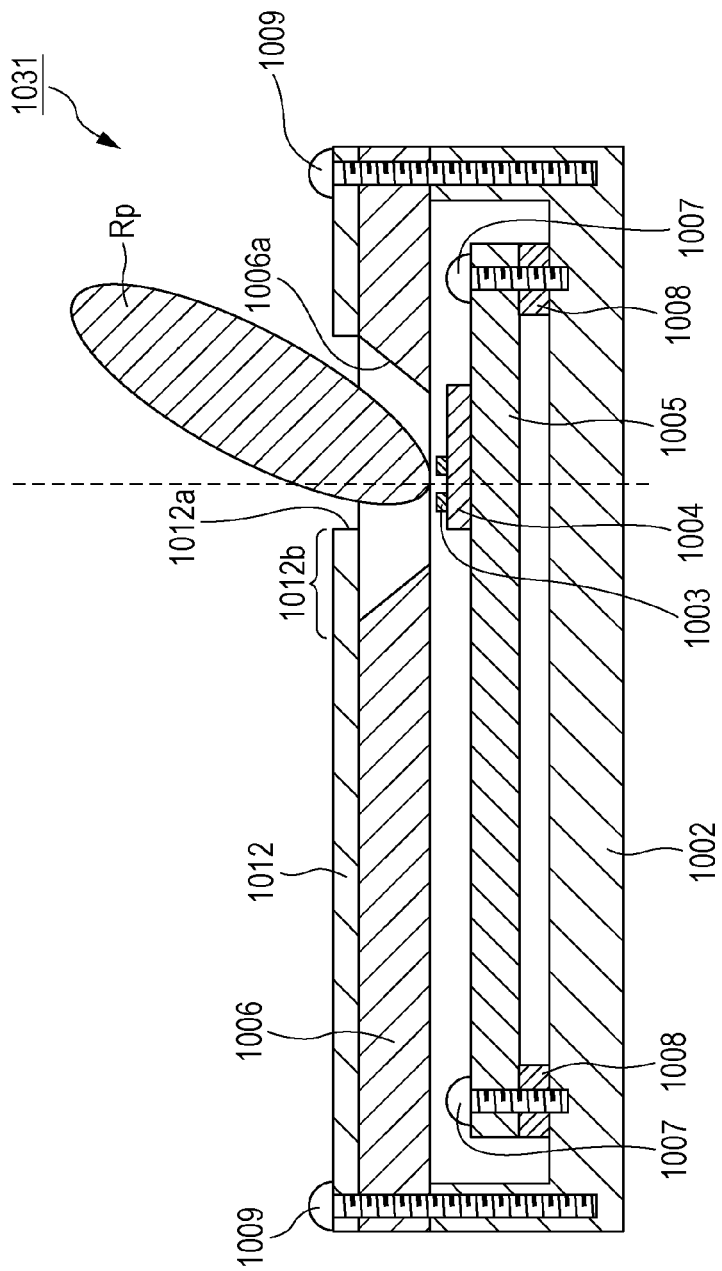
FIG. 19 is a cross-sectional side view illustrating a wireless unit according to an eighth embodiment.

FIG. 19 is a cross-sectional side view illustrating a configuration of a wireless unit according to an eighth embodiment. The components in FIG. 19 that are same as those in FIG. 16 are assigned the same reference numerals as those in FIG. 16, and description thereof is omitted. As described in FIG. 19, a wireless unit 1031 in this embodiment includes a chassis cover 1012 on the upper surface of the second chassis component 1006. The chassis cover 1012 is made of metal and is disposed so as to change the directivity of the antenna element 1003. The chassis cover 1012 of this embodiment differs from the above-described chassis cover 1011 illustrated in FIG. 18. The chassis cover 1012 is thinner than the chassis cover 1011 and an opening 1012a in the chassis cover 1012 is not equally positioned over the antenna element 1003 in four directions. As illustrated in FIG. 19, in this embodiment, the opening 1012a in the chassis cover 1012 has a center away from the center of the opening 1006a in the second chassis component 1006 to the right. The chassis cover 1012 includes a part 1012b (left part in FIG. 19) positioned over a part of the antenna element 1003. Such a configuration makes the antenna radiation pattern Rp be inclined to the right. The directivity is readily changed by attaching the chassis cover 1012 for varying the directivity of the antenna element 1003 on the upper surface of the second chassis component 1006.

Ninth Embodiment

Figure 20:
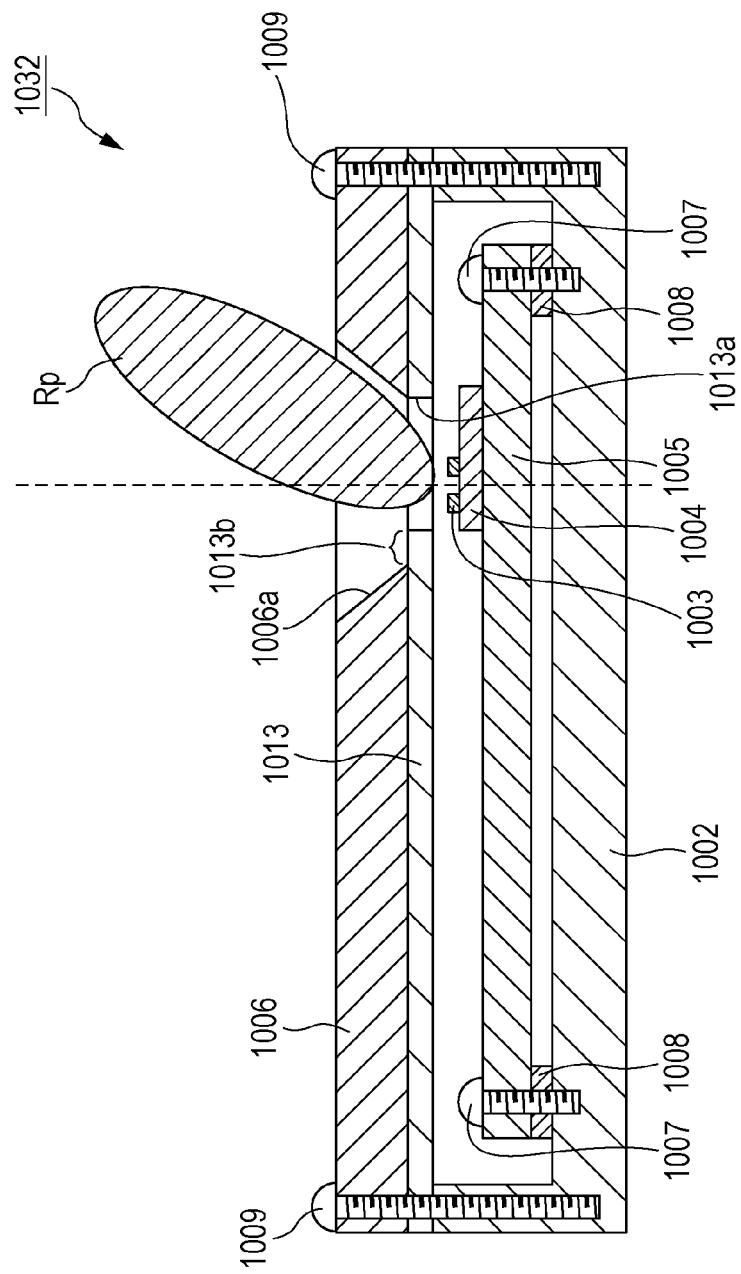
FIG. 20 is a cross-sectional side view illustrating a wireless unit according to a ninth embodiment.

FIG. 20 is a cross-sectional side view illustrating a configuration of a wireless unit according to a ninth embodiment. The components in FIG. 20 that are the same as those in FIG. 16 are assigned the same reference numerals as those in FIG. 16, and description thereof is omitted. As illustrated in FIG. 20, a wireless unit 1032 in this embodiment includes a chassis spacer 1013 for varying the directivity of the antenna element 1003 on a lower surface of the second chassis component 1006. The chassis spacer 1013 is made of metal. The chassis spacer 1013 has substantially the same thickness as the chassis cover 1012 illustrated in FIG. 19. The chassis spacer 1013 has an opening 1013a. As the above-described chassis cover 1012 in the eighth embodiment, the opening 1013a is not equally positioned over the antenna element 1003 in four directions to vary the directivity of the antenna element 1003. In FIG. 20, a part 1013b (left part in FIG. 20) of the chassis spacer 1013 is positioned over the antenna element 1003, and thus the antenna radiation pattern Rp is inclined to the right.

Tenth Embodiment

Figure 21:
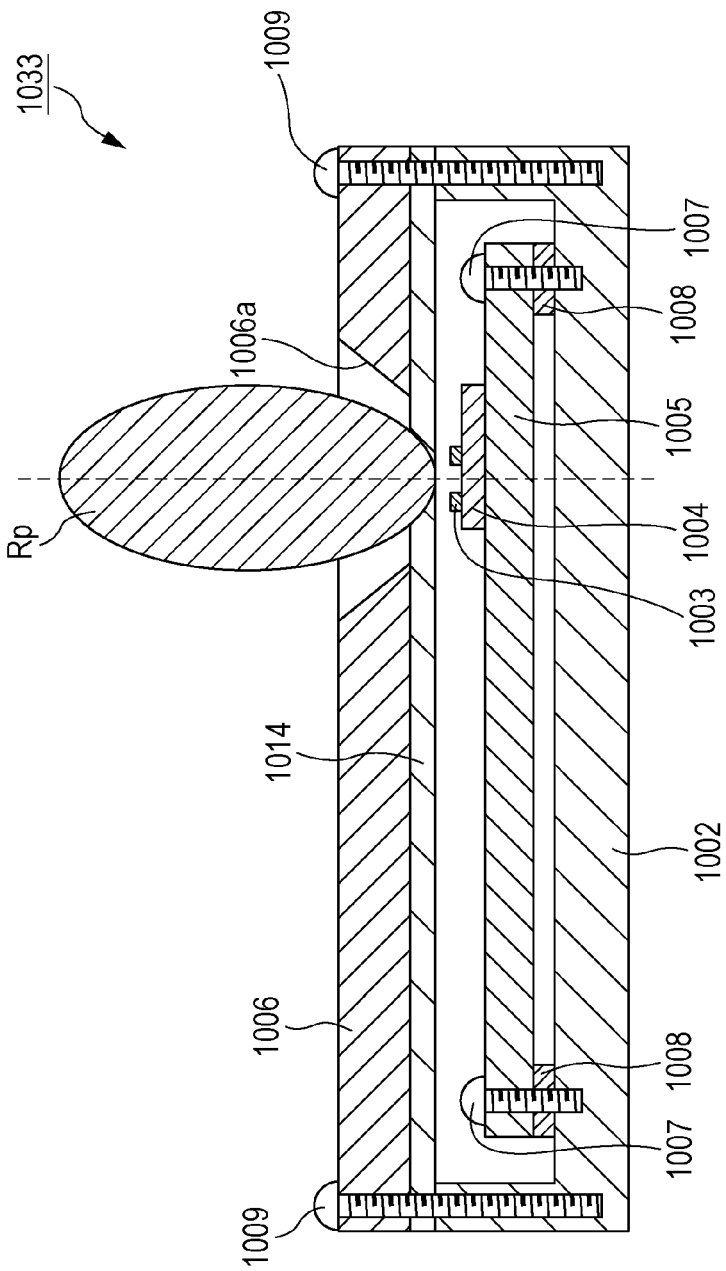
FIG. 21 is a cross-sectional side view illustrating a wireless unit according to a tenth embodiment.

FIG. 21 is a cross-sectional side view illustrating a configuration of a wireless unit according to a tenth embodiment. The components in FIG. 21 that are the same as those in FIG. 16 are assigned the same reference numerals as those in FIG. 16, and description thereof is omitted. As illustrated in FIG. 21, a wireless unit 1033 in this embodiment includes a dielectric sheet 1014 on the lower surface of the second chassis component 1006. The dielectric sheet 1014 is made of resin (ABS resin, for example) and is disposed so as to vary the directivity of the antenna element 1003. In the wireless unit 1033, air is present in a space above the antenna element 1003 and in a space in the opening 1006a in the second chassis component 1006. The dielectric sheet 1014 having a relative permittivity of more than 1 is disposed between these spaces. With this configuration, the radio waves from the antenna element 1003 are refracted at the surface of the dielectric sheet 1014 and the directivity thereof is varied. The directivity varies depending on the distance of the dielectric sheet 1014 from the antenna element 1003, the thickness, and the permittivity of the dielectric sheet 1014. Thus, the half-value angle of the antenna radiation pattern Rp can be made smaller or larger by the dielectric sheet 1014. In addition, the dielectric sheet 1014 prevents water or dirt from entering the wireless unit 1033.

Eleventh Embodiment

Figure 22:
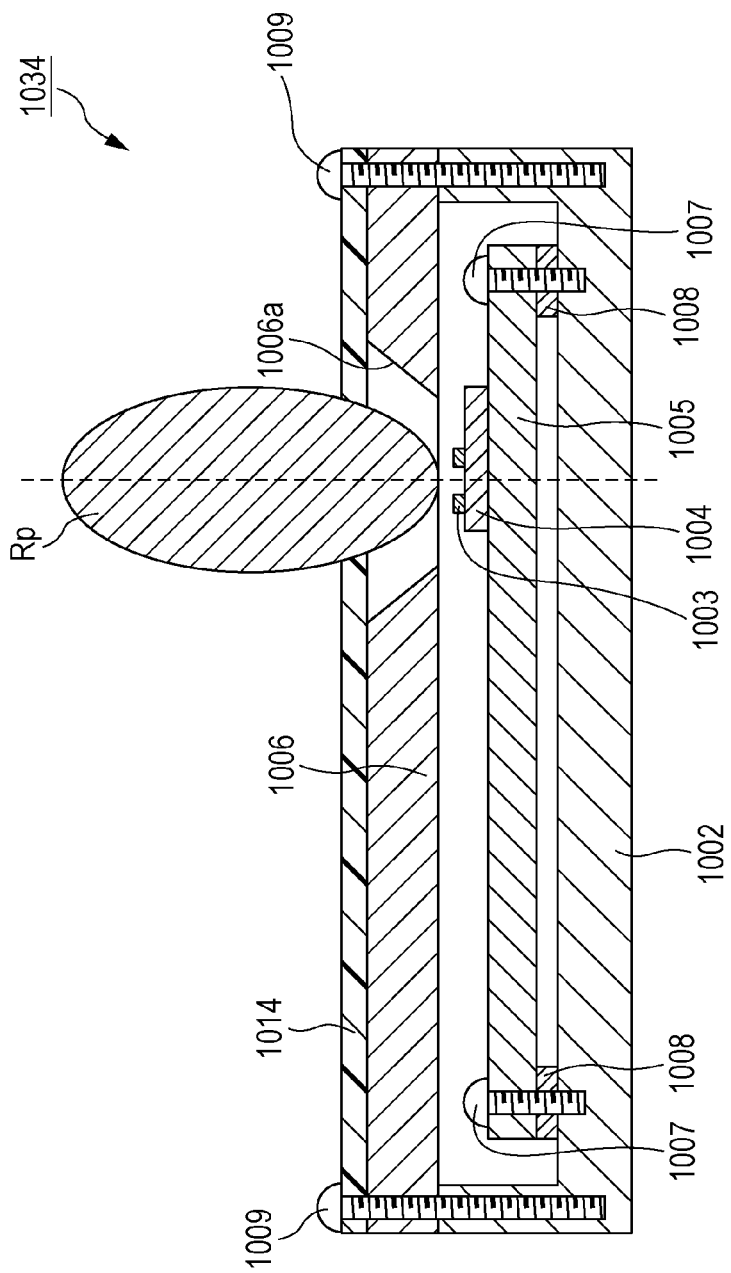
FIG. 22 is a cross-sectional side view illustrating a wireless unit according to an eleventh embodiment.

FIG. 22 is a cross-sectional side view illustrating a configuration of a wireless unit according to an eleventh embodiment. The components in FIG. 22 that are the same as those in FIG. 16 and FIG. 21 are assigned the same reference numerals as those in FIG. 16 and FIG. 21, and description thereof is omitted. As illustrated in FIG. 22, a wireless unit 1034 in this embodiment includes the dielectric sheet 1014 on the upper surface of the second chassis component 1006 to vary the directivity of the antenna element 1003. In the above-described tenth embodiment, the dielectric sheet 1014 is disposed on the lower surface of the second chassis component 1006. The dielectric sheet 1014 can provide the same advantage when disposed on the upper surface of the second chassis component 1006. The dielectric sheet 1014 of the present embodiment also prevents water or dirt from entering the wireless unit 1034.

Twelfth Embodiment

Figure 23:
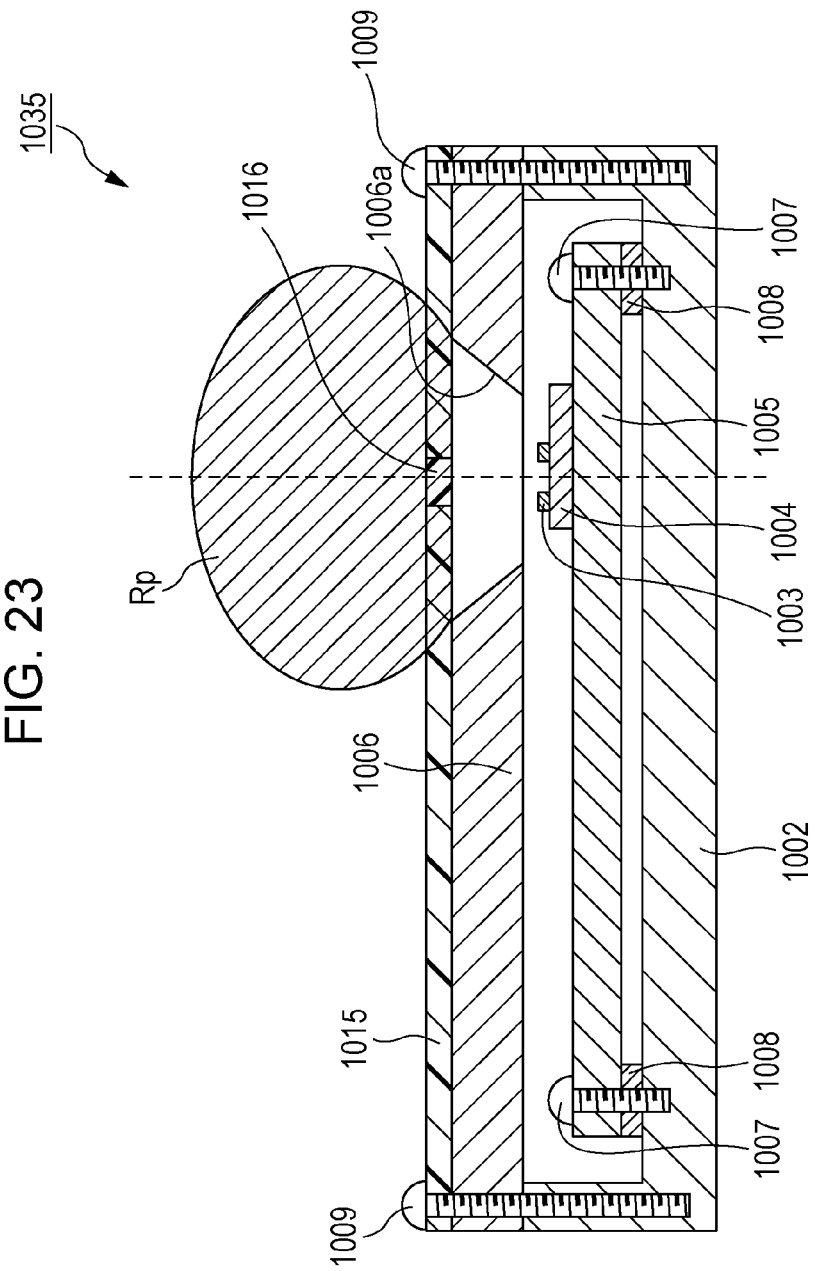
FIG. 23 is a cross-sectional side view illustrating a wireless unit according to a twelfth embodiment.

FIG. 23 is a cross-sectional side view illustrating a configuration of a wireless unit according to a twelfth embodiment. The components in FIG. 23 that are the same as those in FIG. 16 are assigned the same reference numerals as those in FIG. 16, and description thereof is omitted. As illustrated in FIG. 23, a wireless unit 1035 in this embodiment includes a dielectric sheet 1015 made of resin (ABS resin, for example) on the upper surface of the second chassis component 1006. The dielectric sheet 1015 includes a dielectric portion 1016 having different permittivity. The dielectric sheet 1015 varies the directivity of the antenna element 1003. The dielectric portion 1016 has different permittivity than the other parts of the dielectric sheet 1015 and is located at a position corresponding to a part of the opening 1006a in the second chassis component 1006. The dielectric portion 1016 is made of resin (ABS resin, for example) and has higher permittivity than the other parts of the dielectric sheet 1015. In FIG. 23, the center of the opening 1006a in the second chassis component 1006 is aligned with the center of the dielectric portion 1016. The wireless unit 1035 that has the configuration illustrated in FIG. 23 has smaller gain in the front direction. As long as the dielectric portion 1016 has a radio wave transmission characteristic different from that of the other parts of the dielectric sheet 1015, the permittivity of the dielectric portion 1016 may be lowered by including metal particles, using a dielectric having a different dielectric tangent, or including a small air vent. The dielectric sheet 1015 in the present embodiment also prevents water or dirt from entering the wireless unit 1035.

Thirteenth Embodiment

Figure 24:
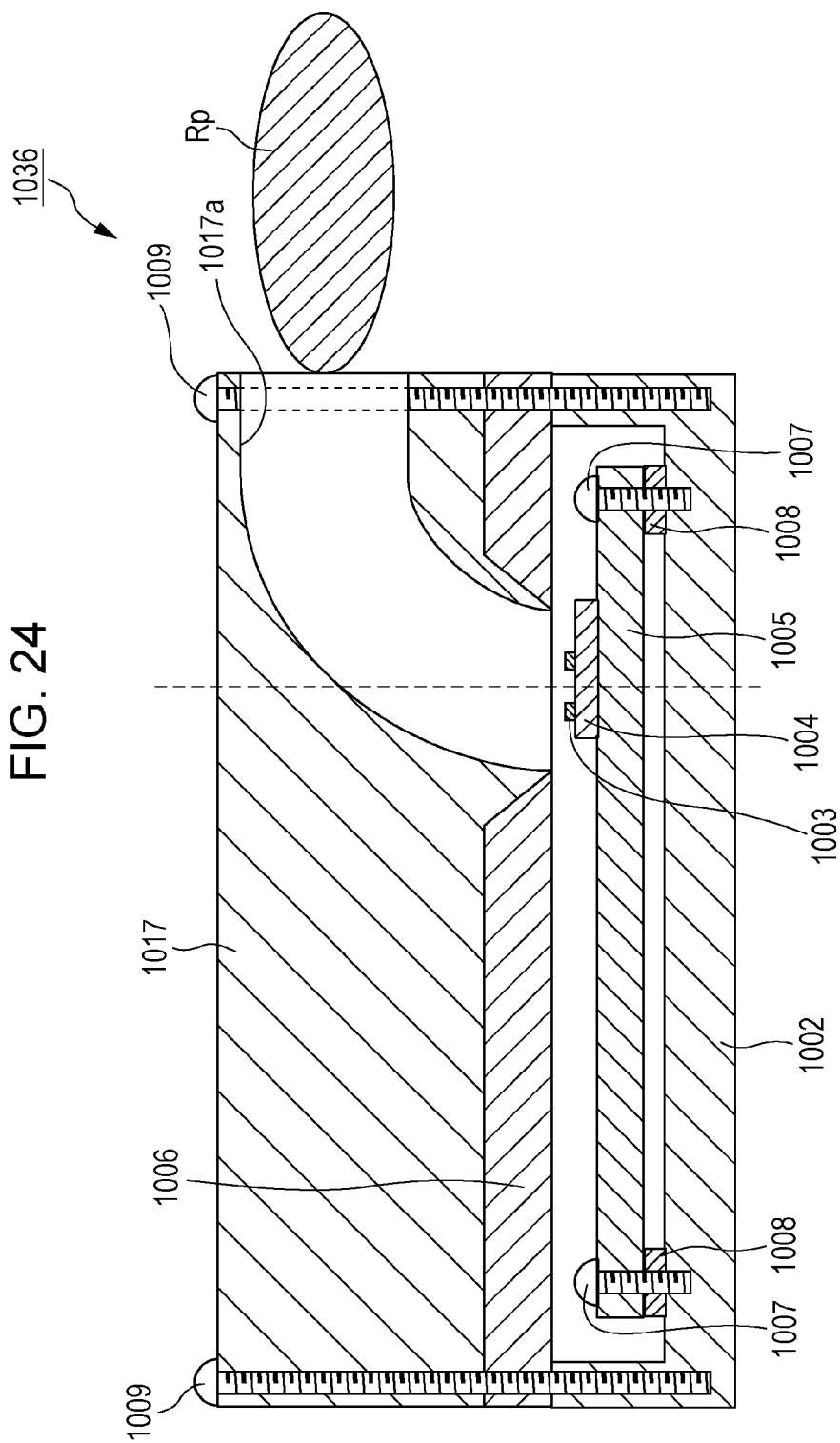
FIG. 24 is a cross-sectional side view illustrating a wireless unit according to a thirteenth embodiment.

FIG. 24 is a cross-sectional side view illustrating a configuration of a wireless unit according to a thirteenth embodiment. The components in FIG. 24 that are the same as those in FIG. 16 are assigned the same reference numerals as those in FIG. 16, and description thereof is omitted. As illustrated in FIG. 24, a wireless unit 1036 in this embodiment includes a chassis cover 1017 on the upper surface of the second chassis component 1006. The chassis cover 1017 is made of metal and includes an opening 1017a that curves at a position above the antenna element 1003 in a planar direction of the wireless module 1004. The chassis cover 1017 allows the radio wave from the antenna element 1003 to be radiated in the planar direction of the wireless module 1004. The directivity of the antenna element 1003 in FIG. 24 is substantially the same as that in FIG. 18, since the opening 1017a has substantially the same size as the opening 1011a in the chassis cover 1011 in FIG. 18. The smaller the opening 1017a the lower the directivity, and the larger the opening 1017a the higher the directivity. The directivity is readily varied by attaching the chassis cover 1017 for varying the directivity of the antenna element 1003 on the upper surface of the second chassis component 1006.

In this embodiment, the opening 1017a extends in the planar direction of the wireless module 1004. However, the opening 1017a may extend in an oblique direction or toward a rear surface.

Fourteenth Embodiment

Figure 25:
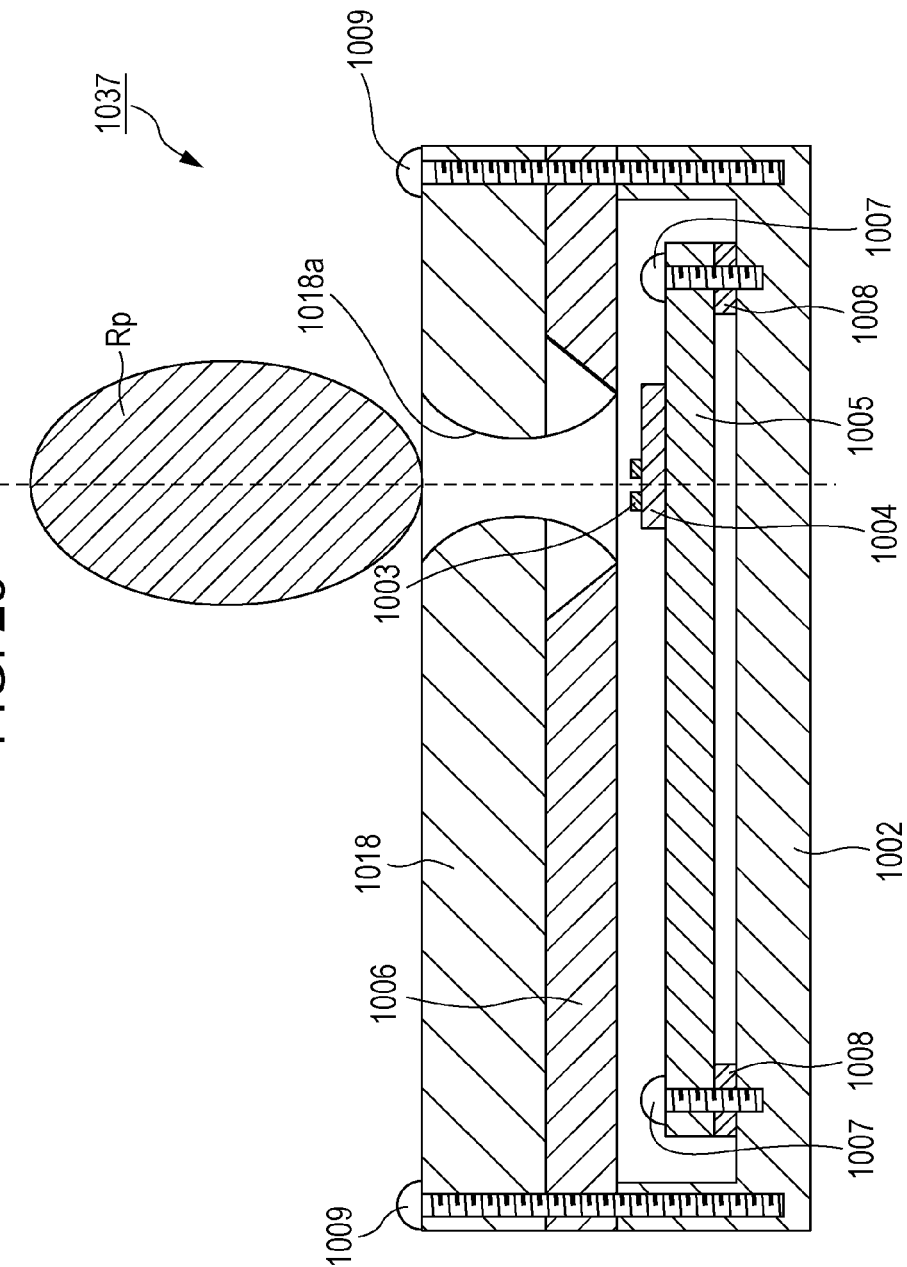
FIG. 25 is a cross-sectional side view illustrating a wireless unit according to a fourteenth embodiment.

FIG. 25 is a cross-sectional side view illustrating a configuration of a wireless unit according to a fourteenth embodiment. The components in FIG. 25 that are the same as those in FIG. 16 are assigned the same reference numerals as those in FIG. 16, and description thereof is omitted. As illustrated in FIG. 25, a wireless unit 1037 in this embodiment includes a chassis cover 1018 on the upper surface of the second chassis component 1006. The chassis cover 1018 is made of metal and includes an opening 1018a that is a twist waveguide or a circularly polarized waveguide. In the wireless unit 1037 that includes the twist waveguide as the opening 1018a in the chassis cover 1018, the polarized wave from the antenna element 1003 is rotated. In the wireless unit 1037 that includes the circularly polarized waveguide as the opening 1018a in the chassis cover 1018, the linearly-polarized wave is changed to a circularly-polarized wave. In the wireless unit 1037, the change in the polarized wave changes the influence of the reflected waves around it.

Fifteenth Embodiment

Figure 26:
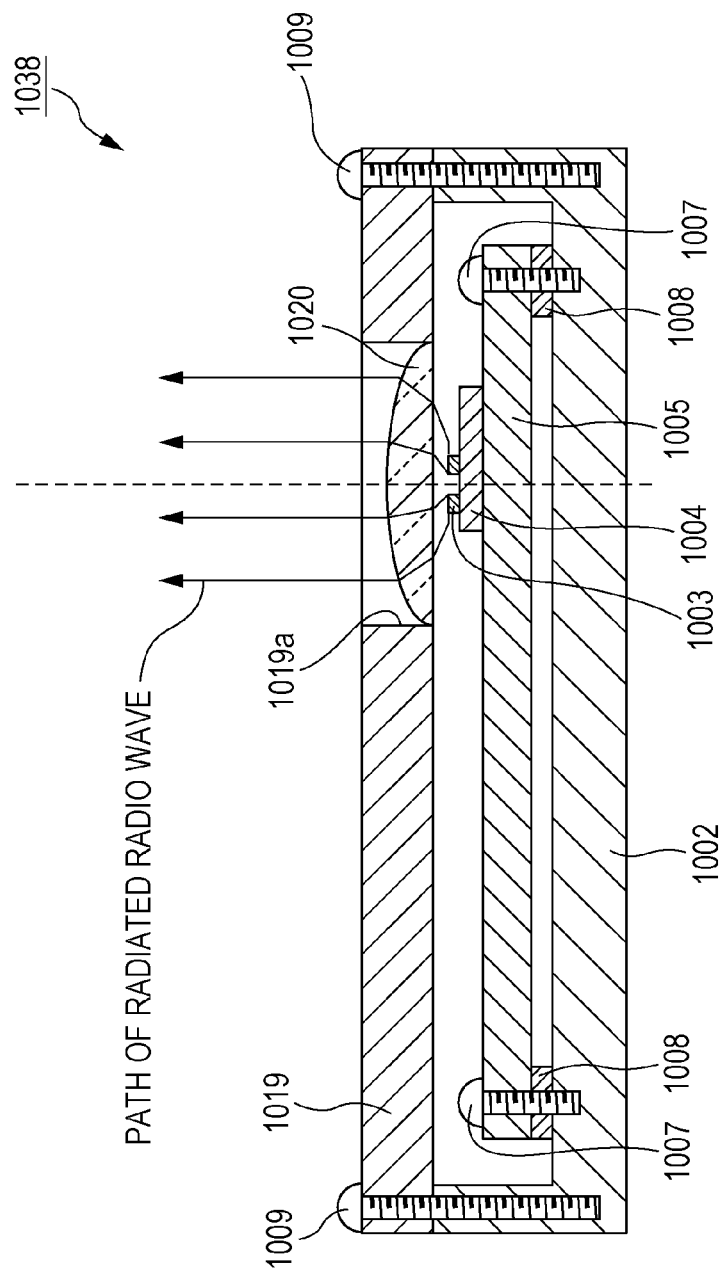
FIG. 26 is a cross-sectional side view illustrating a wireless unit according to a fifteenth embodiment.

FIG. 26 is a cross-sectional side view illustrating a configuration of a wireless unit according to a fifteenth embodiment. The components in FIG. 26 that are the same as those in FIG. 16 are assigned the same reference numerals as those in FIG. 16, and description thereof is omitted. As illustrated in FIG. 26, a wireless unit 1038 in this embodiment includes a convex lens 1020 in an opening 1019a in a second chassis component 1019. The opening 1019a in the second chassis component 1019 has a cylindrical shape having a constant size from the upper surface to the lower surface of the second chassis component 1019. In the opening 1019a, the lens 1020 is disposed. The opening 1019a in the second chassis component 1019 is located at a position corresponding to the antenna element 1003 of the wireless module 1004. Since the lens 1020 can change the path of the radio waves from the antenna element 1003, any directivity is obtained by changing the thickness or the curvature of the lens 1020, or by changing the permittivity of the dielectric used in the lens 1020.

Sixteenth Embodiment

Figure 27:
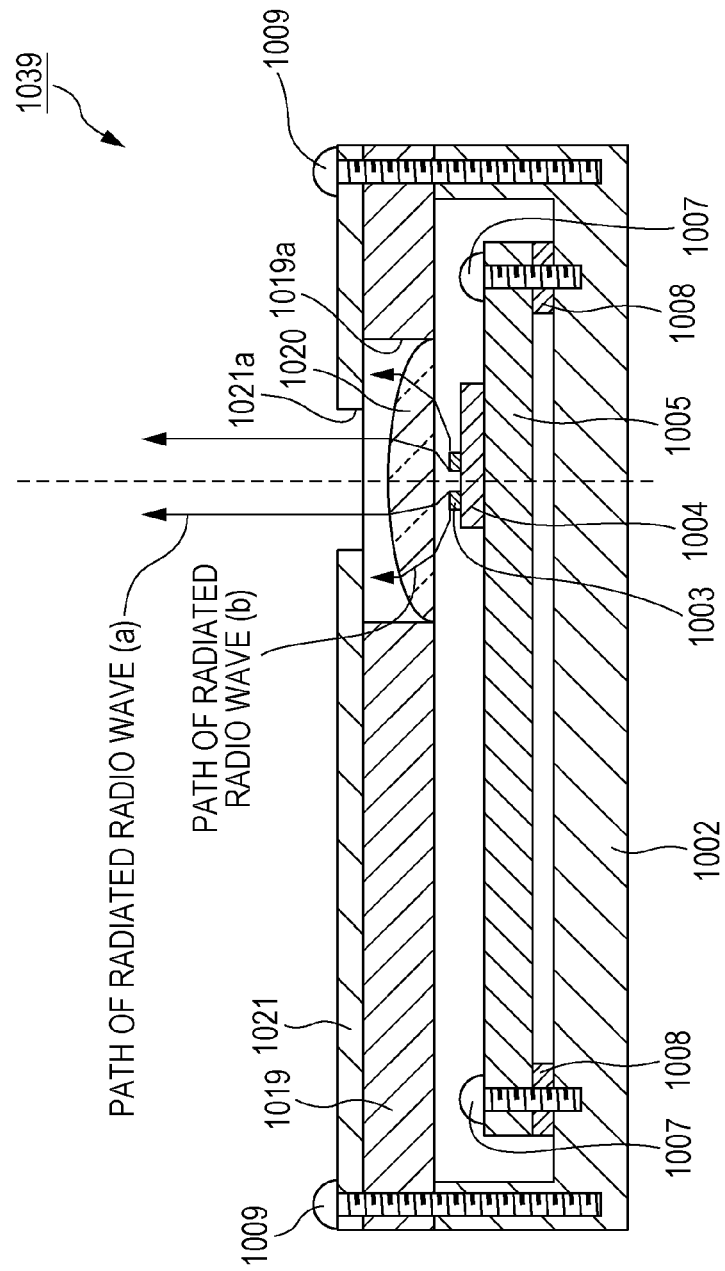
FIG. 27 is a cross-sectional side view illustrating a wireless unit according to a sixteenth embodiment.

FIG. 27 is a cross-sectional side view illustrating a configuration of a wireless unit according to a sixteenth embodiment. The components in FIG. 27 that are the same as those in FIG. 16 and FIG. 26 are assigned the same reference numerals as those in FIG. 16 and FIG. 26, and description thereof is omitted. As illustrated in FIG. 27, a wireless unit 1039 in this embodiment includes a chassis cover 1021 in addition to the components in the above-described fifteenth embodiment. The chassis cover 1021 is made of metal and is disposed on the upper surface of the second chassis component 1019. The chassis cover 1021 has an opening 1021*a* at a position corresponding to the antenna elements 1003 of the wireless module 1004. The opening 1021*a* in the chassis cover 1021 is smaller than the opening 1019*a* in the second chassis component 1019. A path (a) of the radio waves radiated from the antenna element 1003 is not blocked by the chassis cover 1021 and is available for communication. However, a path (b) of the radio waves radiated from the antenna element 1003 is blocked by the chassis cover 1021 and is not available for communication, since the radio wave does not reach the other end. In the wireless unit 1039, the directivity can be made narrower.

Seventeenth Embodiment

FIG. 28 is a cross-sectional side view illustrating a configuration of a wireless unit according to a seventeenth embodiment. The components in FIG. 28 that are the same as those in FIG. 16 and FIG. 26 are assigned the same reference numerals as those in FIG. 16 and FIG. 26, and description thereof is omitted. As illustrated in FIG. 28, a wireless unit 1040 in this embodiment includes a dielectric sheet 1022 on the lower surface of the second chassis component 1019. The dielectric sheet 1022 is made of resin (ABS resin, for example). In the wireless unit 1040, as indicated by a path (c), the path of radio waves from the antenna element 1003 extends more outwardly due to the dielectric sheet 1022 compared to the above-described radiation pattern obtained by using the lens 1020 illustrated in FIG. 26. In the present embodiment, the antenna radiation pattern can be made wider compared to the above-described radiation pattern in FIG. 26.

In the above-described wireless units in the sixth to ninth, thirteenth, and fourteenth embodiments, the opening 1006*a* in the second chassis component 1006 is hollow. However, the opening 1006*a* may have an airtight structure as long as the opening 1006*a* allows the radio waves to pass therethrough. The airtight structure may be obtained by filling the opening 1006*a* with a dielectric other than air (ABS resin, for example) or sealing a part of the opening 1006*a*. In the above-described tenth to twelfth embodiments, the opening 1006*a* in the second chassis component 1006 is closed by the dielectric sheet 1014 or 1015 and has an airtight structure. In the above-described fifteenth and sixteenth embodiments, the opening 1019*a* in the second chassis component 1019 is closed by the lens 1020. In the above-described seventeenth embodiment, the opening 1019*a* in the second chassis component 1019 is closed by the lens 1020 and the dielectric sheet 1022.

The first to seventeenth embodiments are described above with reference to the drawings, but the present disclosure should not be limited thereto. It is apparent that a person skilled in the art may perform various changes and modifications within the scope described in the claims. It is to be understood that these changes and modifications are within the technical scope of the present disclosure.

Brief Description of Aspects of the Present Disclosure

An antenna device according to a first aspect of an antenna device of the present disclosure includes an antenna element and a metal plate having a length of 1/10 or more of an operating wavelength and positioned in a vertical direction relative to a plane surface of the antenna element and in a predetermined distance from the antenna element.

In the antenna device of a second aspect according to the first aspect of the antenna device, the metal plate includes a bent portion that is a front end portion bent over a part of the antenna element.

In the antenna device of a third aspect according to the second aspect of the antenna device, the bent portion extends perpendicular to a main body of the metal plate.

In the antenna device of a fourth aspect according to the first aspect of the antenna device, the metal plate includes a bent portion that is a front end portion bent over an entire upper surface of the antenna element, and the bent portion has an opening at a position corresponding to a part of the antenna element.

In the antenna device of a fifth aspect according to the fourth aspect of the antenna device, the bent portion forms a predetermined angle with the main body of the metal plate.

In the antenna device of a sixth aspect according to the first aspect of the antenna device, the metal plate includes a meshed bent portion that is a front end portion bent over an entire upper surface of the antenna element.

In the antenna device of a seventh aspect according to the sixth aspect of the antenna device, the meshed bent portion forms a predetermined angle with a main body of the metal plate.

In the antenna device of an eighth aspect according to any one of the first to eight aspects of the antenna device, the antenna element operates in a millimeter-wave band.

An antenna device of a ninth aspect includes an antenna element, and a dielectric component having a polygonal cross-sectional shape and disposed over at least a part of the antenna element.

An antenna device according to a tenth aspect includes a mounting substrate, and an antenna element that forms a predetermined angle with the mounting substrate and operates in a millimeter-wave band.

Brief Description of Further Aspects of the Present Disclosure

A wireless unit according to a first aspect of a wireless unit of the present disclosure includes a first chassis component, an antenna element housed in the first chassis component, and a second chassis component attached to the first chassis component and having an opening at a position corresponding to the antenna element.

In the wireless unit of a second aspect according to the first aspect of the wireless unit, the opening in the second chassis component has a tapered shape.

The wireless unit of a third aspect according to the first or second aspect of the wireless unit further includes a chassis cover attached to an outer surface of the second chassis component and including an opening having a size that is different from that of the opening in the second chassis component.

In the wireless unit of a fourth aspect according to the third aspect of the wireless unit, the opening in the chassis cover has a center at a position away from a center of the opening in the second chassis component.

The wireless unit of a fifth aspect according to the first or second aspect of the wireless unit further includes a chassis spacer attached to an inner surface of the second chassis component and including an opening having a size that is different from that of the opening in the second chassis component.

In the wireless unit of a sixth aspect according to the fifth aspect of the wireless unit, the opening in the chassis spacer has a center away from a center of the opening in the second chassis component.

The wireless unit of a seventh aspect according to the first or second aspect of the wireless unit further includes a dielectric sheet attached to an inner surface of the second chassis component so as to close the opening in the second chassis component.

The wireless unit of an eight aspect according to the first or second aspect of the wireless unit further includes a dielectric sheet attached to an outer surface of the second chassis component so as to close the opening in the second chassis component.

In the wireless unit of a ninth aspect according to the eighth aspect of the wireless unit, the dielectric sheet includes a dielectric portion having a permittivity that is different from that of the dielectric sheet at a position corresponding to a part of the opening in the second chassis component.

In the wireless unit of a tenth aspect according to the third aspect of the wireless unit, the opening in the chassis cover curves such that an open end of the opening faces in a horizontal direction.

In the wireless unit of an eleventh aspect according to the third aspect of the wireless unit, the opening in the chassis cover is a twist waveguide or a circularly polarized waveguide.

The wireless unit of a twelfth aspect according to the first aspect of the wireless unit further includes a lens in the opening in the second chassis component.

The wireless unit of a thirteenth aspect according to the twelfth aspect of the wireless unit further includes a chassis cover attached to an outer surface of the second chassis component so as to cover a part of the lens.

The wireless unit of a fourteenth aspect according to the twelfth aspect of the wireless unit further includes a dielectric sheet attached to an inner surface of the second chassis component so as to cover the lens in the opening in the second chassis component.

In the wireless unit of a fifteenth aspect according to any one of the first to fourteenth aspects of the wireless unit, the antenna element operates in a millimeter-wave band.

The present disclosure is advantageously used in a wireless communication device for microwave or millimeter-wave communication.

What is claimed is:

1. An antenna device comprising:
a planar antenna element having a plane surface; and
a metal plate having a length of $\frac{1}{10}$ or more of an operating wavelength and positioned such that the length extends substantially perpendicular relative to the plane surface of the antenna element, and a virtual line substantially perpendicular to a surface of the metal plate extends substantially in parallel to the plane surface of the antenna element, wherein
a gap is provided between the metal plate and the antenna element along the virtual line, and
of an area consisting of virtual surfaces that collectively surround the antenna element, wherein the virtual surfaces are substantially perpendicular relative to the plane surface of the antenna element, one or more portions not occupied by the metal plate are open.

2. The antenna device according to claim 1, wherein the metal plate includes a bent portion that is bent over a part of the plane surface the antenna element.

3. The antenna device according to claim 2, wherein the bent portion extends perpendicular to the surface of the metal plate.

4. The antenna device according to claim 1, wherein the metal plate includes a bent portion that is bent over an entire area of the plane surface of the antenna element, and
the bent portion has an opening at a position corresponding to at least a part of the plane surface of the antenna element.

5. The antenna device according to claim 4, wherein the bent portion forms a predetermined angle with the surface of the metal plate.

6. The antenna device according to claim 1, wherein the metal plate includes a meshed bent portion that is bent over an entire area of the plane surface of the antenna element.

7. The antenna device according to claim 6, wherein the meshed bent portion forms a predetermined angle with the surface of the metal plate.

8. The antenna device according to claim 1, wherein the antenna element operates in a millimeter-wave band.

* * * * *